US008290325B2

(12) United States Patent
Reshotko et al.

(10) Patent No.: US 8,290,325 B2
(45) Date of Patent: Oct. 16, 2012

(54) WAVEGUIDE PHOTODETECTOR DEVICE AND MANUFACTURING METHOD THEREOF

(75) Inventors: Miriam R. Reshotko, Portland, OR (US); Bruce A. Block, Portland, OR (US)

(73) Assignee: Intel Corporation, Santa Clara, CA (US)

( * ) Notice: Subject to any disclaimer, the term of this patent is extended or adjusted under 35 U.S.C. 154(b) by 145 days.

(21) Appl. No.: 12/217,066

(22) Filed: Jun. 30, 2008

(65) Prior Publication Data

US 2009/0324164 A1 Dec. 31, 2009

(51) Int. Cl.
*G02B 6/10* (2006.01)

(52) U.S. Cl. .......................................... 385/129; 430/321

(58) Field of Classification Search ................ 385/2, 14, 385/15, 39, 49, 129; 257/82, 458, 466; 430/321
See application file for complete search history.

(56) References Cited

U.S. PATENT DOCUMENTS

| | | | | |
|---|---|---|---|---|
| 4,762,382 A | * | 8/1988 | Husain et al. ................. | 385/132 |
| 4,893,162 A | * | 1/1990 | Gentner et al. ................ | 257/189 |
| 5,121,182 A | * | 6/1992 | Kuroda et al. ................. | 257/432 |
| 5,170,448 A | * | 12/1992 | Ackley et al. .................. | 385/31 |
| 5,391,869 A | * | 2/1995 | Ade et al. ................. | 250/227.24 |
| 5,783,844 A | * | 7/1998 | Kobayashi et al. ........... | 257/103 |
| 6,278,820 B1 | * | 8/2001 | Hayes .............................. | 385/39 |
| 6,307,242 B1 | * | 10/2001 | Sugiyama ..................... | 257/432 |
| 6,312,581 B1 | * | 11/2001 | Bruce et al. .................... | 205/124 |
| 7,397,101 B1 | * | 7/2008 | Masini et al. ................. | 257/458 |
| 2002/0018636 A1 | * | 2/2002 | Bischel et al. ................. | 385/140 |
| 2002/0174827 A1 | * | 11/2002 | Samoilov et al. .............. | 117/84 |
| 2003/0015770 A1 | * | 1/2003 | Talin et al. ..................... | 257/622 |
| 2004/0005133 A1 | * | 1/2004 | Johannessen ................. | 385/130 |
| 2004/0012037 A1 | * | 1/2004 | Venkatesan et al. .......... | 257/200 |
| 2004/0029329 A1 | * | 2/2004 | Borghs et al. ................. | 438/167 |
| 2004/0033044 A1 | * | 2/2004 | Abraham ...................... | 385/129 |
| 2004/0151463 A1 | * | 8/2004 | Talin et al. ..................... | 385/131 |
| 2004/0185386 A1 | * | 9/2004 | Block .......................... | 430/321 |
| 2004/0188794 A1 | * | 9/2004 | Gothoskar et al. ............ | 257/459 |
| 2005/0051767 A1 | * | 3/2005 | Leon et al. ..................... | 257/19 |
| 2005/0053347 A1 | * | 3/2005 | West et al. .................... | 385/129 |
| 2005/0152658 A1 | * | 7/2005 | Keyser .......................... | 385/129 |

(Continued)

FOREIGN PATENT DOCUMENTS

EP 125608 A * 11/1984

OTHER PUBLICATIONS

Ahn et al.; High performance, waveguide integrated GE photodetectors; Optics Express, vol. 15, No. 7; Apr. 2, 2007; p. 3916.*

(Continued)

*Primary Examiner* — Charlie Peng
*Assistant Examiner* — Peter Radkowski
(74) *Attorney, Agent, or Firm* — Winkle, PLLC

(57) ABSTRACT

Embodiments of the present invention describe a waveguide-based photodetector device and its methods of fabrication. The waveguide photodetector device comprises a substrate having a cladding structure formed thereon. A waveguide element for receiving optical signals is disposed within the cladding structure. A portion of the waveguide element is encapsulated by a photodetector element that detects the optical signal received by the waveguide element and generates an electrical signal based on the optical signal. Encapsulating the waveguide element in the photodetector element improves coupling efficiency and enables a waveguide photodetector device with higher speeds and higher responsivity.

26 Claims, 20 Drawing Sheets

U.S. PATENT DOCUMENTS

| | | | |
|---|---|---|---|
| 2005/0214989 A1* | 9/2005 | Keyser | 438/155 |
| 2005/0236619 A1* | 10/2005 | Patel et al. | 257/57 |
| 2005/0280007 A1* | 12/2005 | Hsu et al. | 257/79 |
| 2006/0039666 A1* | 2/2006 | Knights et al. | 385/129 |
| 2007/0018270 A1* | 1/2007 | Leon et al. | 257/458 |
| 2007/0053643 A1* | 3/2007 | West et al. | 385/131 |
| 2007/0101927 A1* | 5/2007 | Keyser et al. | 117/20 |
| 2007/0104410 A1* | 5/2007 | Ahn et al. | 385/14 |
| 2007/0235877 A1 | 10/2007 | Reshotko et al. | |
| 2008/0193076 A1* | 8/2008 | Witzens et al. | 385/14 |
| 2009/0269878 A1* | 10/2009 | Leon et al. | 438/98 |
| 2009/0302426 A1* | 12/2009 | McLaughlin et al. | 257/616 |

OTHER PUBLICATIONS

Tao Yin et al., "31GHz Ge *n-i-p* waveguide photodetectors on Silicon-on-Insulator substrate" Oct. 17, 2007/vol. 15, No. 21/ Optics Express 13965, USA.

* cited by examiner

WAVEGUIDE PHOTODETECTOR DEVICE AND MANUFACTURING METHOD THEREOF

BACKGROUND OF THE INVENTION

1. Field of the Invention

The present invention relates to the field of optoelectronic devices and more particularly to a waveguide-based photodetector device and manufacturing method thereof.

2. Discussion of Related Art

Over recent years, the increasing computing power of integrated circuits, such as a microprocessor, has been enabled by downscaling the size of basic devices such as transistors and metal interconnects. However, the smaller dimensions of metal interconnect lead to undesirable effects such as increased interconnect delays, electromagnetic interference (EMI) and power consumption. In that regard, optical interconnects have been proposed as an alternative to metal interconnects. Optical interconnects have the advantages of being resistant to EMI and decrease interconnect delays and power consumption. Furthermore, the optical interconnect serves as a better alternative in keeping pace with increasing transistor speed as it offers higher bandwidths than metal interconnects.

One type of optical interconnect involves the use of a waveguide-based photodetector device comprising a photodetector element coupled to an optical waveguide. The optical waveguide serves as a medium for guiding light containing an optical signal to the photodetector element which is able to detect the optical signal and converts it into an electrical signal. In a conventional waveguide-based photodetector device, the photodetector element is evanescently coupled to the optical waveguide such that the photodetector element is disposed either underneath or on top the optical waveguide with only one common interface.

FIG. 1 illustrates a cross-sectional view of a conventional waveguide-based photodetector device comprising a substrate 110, an oxide layer 120 and a rib waveguide 130 for receiving light. The photodetector device is made from a silicon on insulator (SOI) substrate such that the rib waveguide 130 is patterned from the top silicon film of the SOI substrate. A photodetector element 140 made of germanium (Ge) is disposed on the top surface 135 of the rib waveguide 130 to absorb light from the rib waveguide 130 and generate an electrical signal based on the amount of light absorbed. N-type contact 161 and p-type contact 162 are coupled to the photodetector element 140 to transmit the electrical signal to other devices.

As illustrated in FIG. 1, the photodetector element 140 is evanescently coupled to the rib waveguide 130 such that photodetector element 140 is disposed on the top surface 135 of the rib waveguide 130. In this case, the length of the photodetector element 140 has to be at least 40 μm long in order to obtain an effective coupling efficiency. A weak coupling efficiency between the photodetector element 140 and the rib waveguide 130 affects the speed and responsivity of the photodetector device. In addition, the 40 μm long photodetector element 140 takes up a considerable amount of "real estate" in the device layer of an integrated circuit based on current technology standards. Furthermore, the photodetector device is made from part of a SOI substrate, which makes it difficult to integrate the photodetector device into later stages of an integrated circuit fabrication process.

DETAILED DESCRIPTION OF THE PRESENT INVENTION

A waveguide-based photodetector device and its method of fabrication are described. In the following description, numerous specific details are set forth in order to provide a thorough understanding of the present invention. In other instances, well known semiconductor processing techniques and features have not been described in particular detail in order not to unnecessarily obscure the present invention.

Embodiments of the present invention describe a waveguide-based photodetector device and its methods of fabrication. In an embodiment of the present invention, the waveguide photodetector device comprises a substrate having a cladding structure formed thereon. A waveguide element for receiving optical signals is disposed within the cladding structure. The top surface and the portions of sidewalls of the waveguide element is encapsulated by a photodetector element that detects the optical signal received by the waveguide element and generates an electrical signal based on the optical signal.

In an embodiment of the present invention, the method of forming a waveguide photodetector device comprises forming a waveguide element on a substrate. Then, a cladding layer is formed on both the waveguide element and substrate, wherein the cladding layer exposes a portion of the waveguide element. Next, a photodetector element is formed on the waveguide element such that the photodetector element encapsulates the top surface and the portions of sidewalls of the waveguide element. Encapsulating the waveguide element improves coupling efficiency between the waveguide element and the photodetector element. As a result, the waveguide photodetector device is able to operate at greater speeds and higher responsivity.

Figure 1:
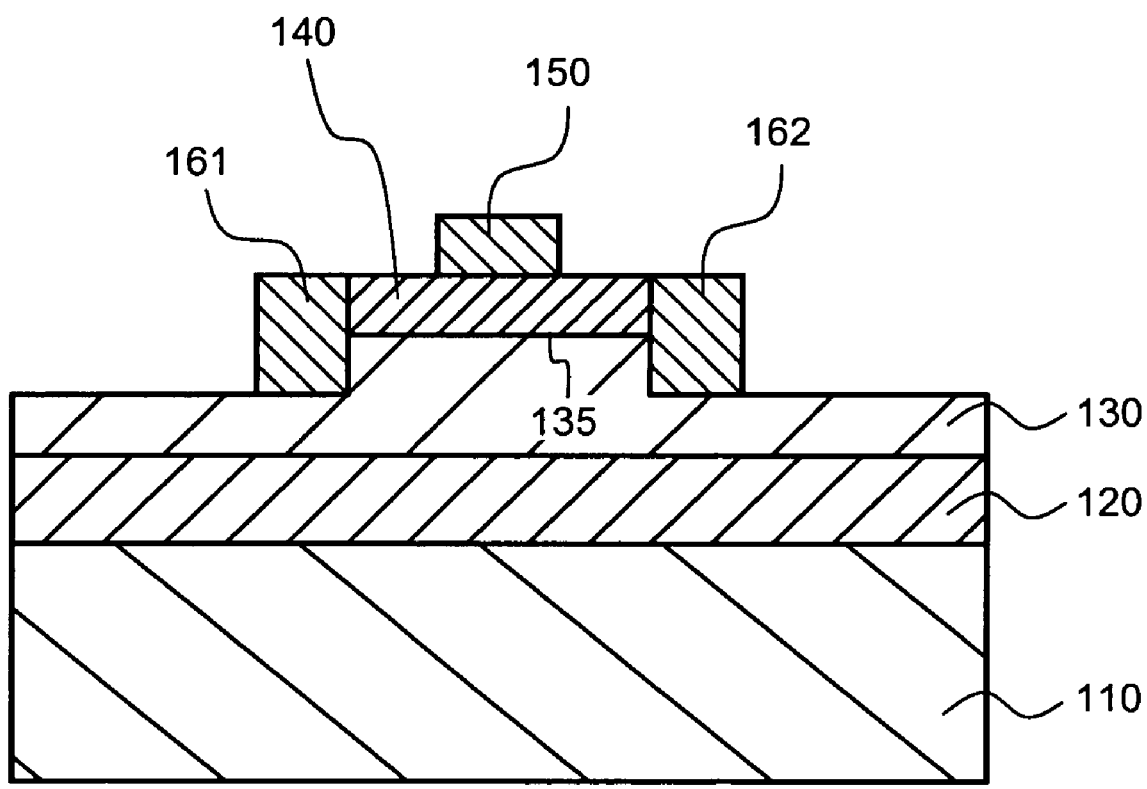
FIG. 1 is a cross-sectional view of a conventional photodetector device.
Figure 2:
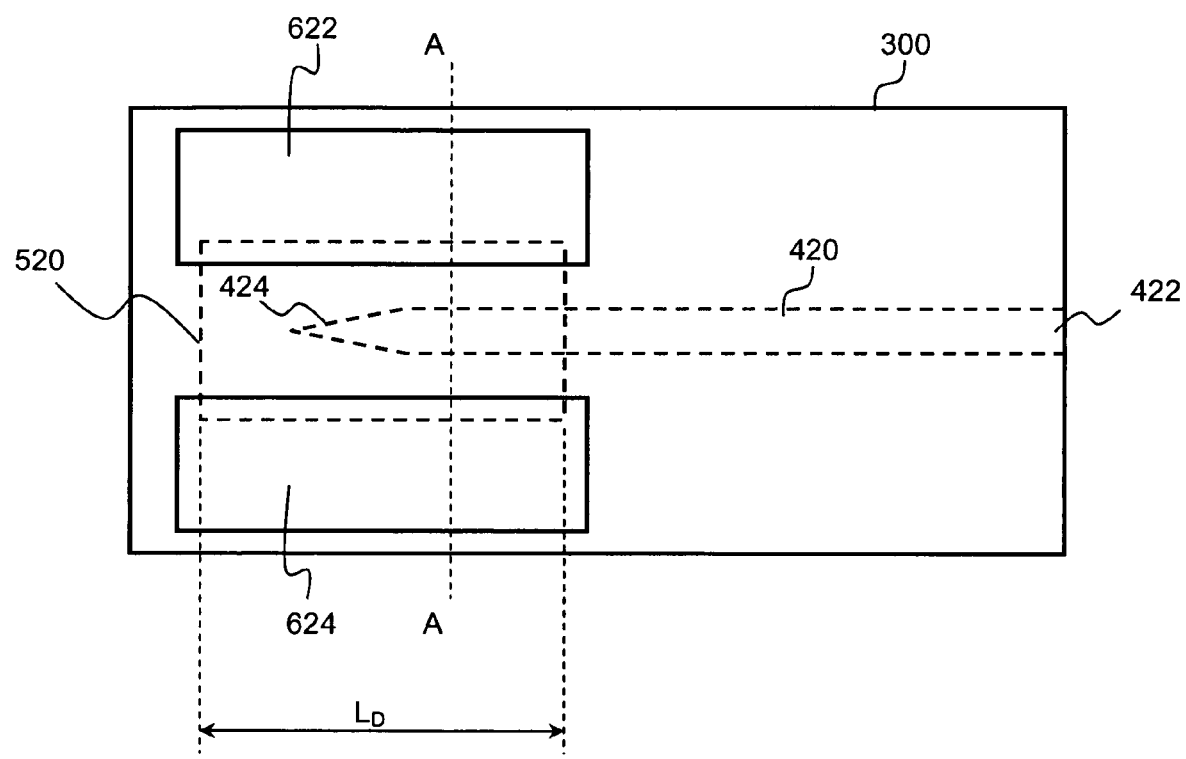
FIG. 2 is an illustration of a waveguide photodetector device in accordance with one embodiment of the present invention.
Figure 3:
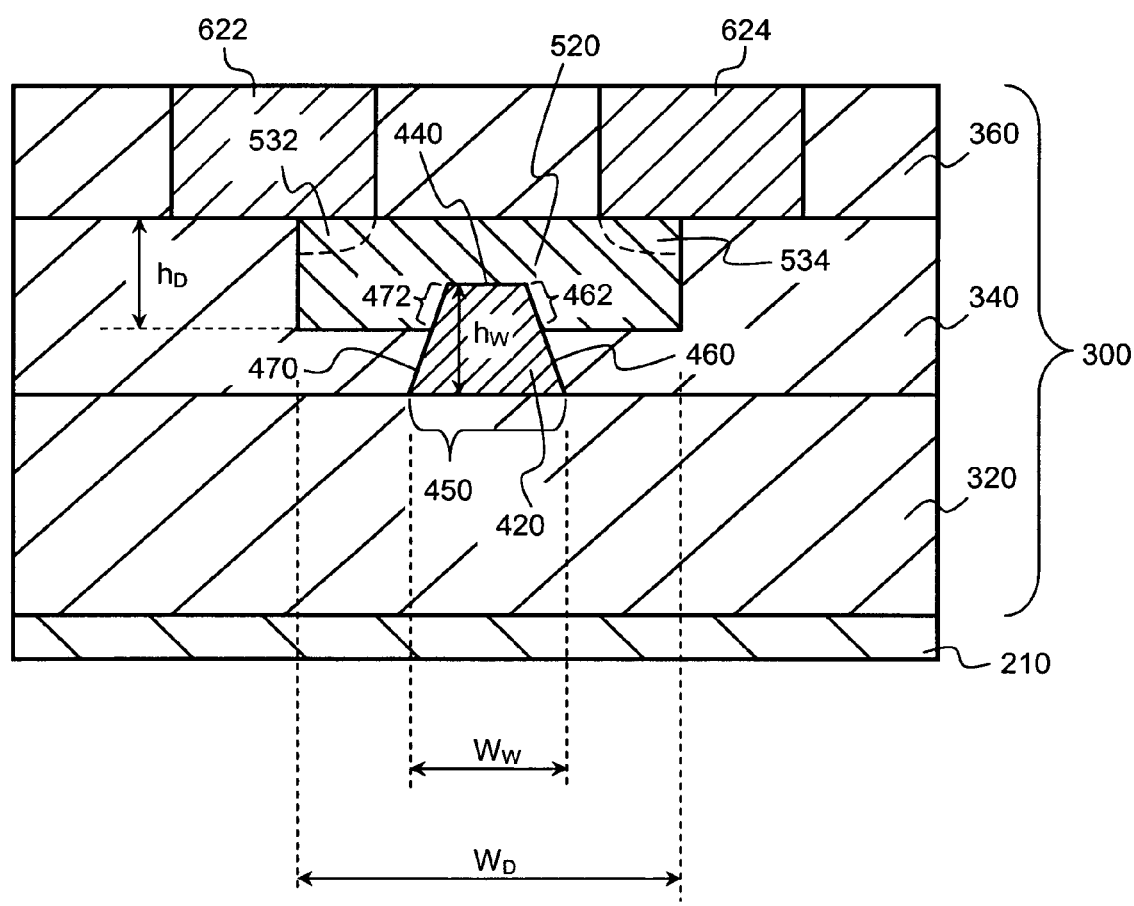
FIG. 3 is a cross-sectional view of the waveguide photodetector device of FIG. 2 along the line A-A.

FIG. 2 illustrates a plan view of a waveguide photodetector device fabricated in accordance with one embodiment of the present invention. FIG. 3 is a cross-sectional view of the waveguide photodetector device of FIG. 2 along the line A-A. Referring to FIG. 2, the waveguide photodetector device comprises a waveguide element 420 disposed within a cladding structure 300. The waveguide element 420 includes a first end 422 for receiving light containing an optical signal and a second end 424 coupled to a photodetector element 520. In one embodiment, the second end 424 of the waveguide element 420 is tapered to minimize back reflection of light transmitted to the second end 424 so as to improve coupling efficiency between the waveguide element 420 and the photodetector element 520.

Now referring to FIG. 3, the waveguide element 420 and photodetector element 520 is disposed within a cladding structure 300. In an embodiment of the present invention, the cladding structure 300 comprises a first cladding layer 320, a second cladding layer 340, and a third cladding layer 360, wherein the second cladding layer 340 is disposed between the first cladding layer 320 and third cladding layer 360. The first cladding layer 320 is formed on a base semiconductor layer 210. In one embodiment, the base semiconductor layer 210 is made of monocrystalline silicon. In one embodiment, the first, second and third cladding layers 320, 340, 360 are made from a material having a refractive index lower than the refractive index of the waveguide element 420. In a specific embodiment, the first, second and third cladding layers 320, 340, 360 are made of an oxide compound material, such as but not limited to silicon dioxide with a refractive index of 1.5.

In an embodiment of the present invention, both the waveguide element 420 and photodetector element 520 are disposed within the second cladding layer 340. The waveguide element 420 includes a top surface 440, a bottom surface 450 and sidewalls 460, 470 extending from the top surface 440 to the bottom surface 450. The bottom surface 450 of the waveguide element 420 is disposed on the first cladding layer 320. In one embodiment, the waveguide element 420 has a trapezoidal cross-sectional shape as shown in FIG. 3. However, it can be appreciated that the waveguide element 420 is not limited to a trapezoid cross-sectional shape but can be formed as other cross-sectional shapes, such as square or rectangular.

The waveguide element 420 is made from any material that enables the propagation of light therein. In an embodiment of the present invention, the waveguide element 420 is made from the topmost silicon layer of a layered silicon-insulator-silicon substrate commonly known as silicon on insulator (SOI) substrate, wherein the first cladding layer 320 is the buried oxide layer of the SOI substrate, and wherein the base semiconductor layer 210 is the silicon substrate of the SOI substrate.

In one embodiment, the waveguide element 420 is made from a material with a higher refractive index than the first, second and third cladding layers 320, 340, 360. In a specific embodiment, the waveguide element 420 is a high index contrast waveguide having a refractive index at least 0.20 higher than the first, second and third cladding layers 320, 340, 360. For example, the waveguide element 420 is made from silicon (Si) with refractive index of 3.5 or silicon nitride (SiN) with refractive index of 2.0 and the first, second and third cladding layers 320, 340, 360 are made of silicon dioxide with refractive index of 1.5.

In a specific embodiment, the waveguide element 420 is a low index contrast waveguide having a refractive index which is 0.05-0.20 higher than the first, second and third cladding layers 320, 340, 360. For example, the waveguide element 420 is made of silicon nitride with refractive index of 1.5 and the first, second and third cladding layers 320, 340, 360 are made of silicon oxynitride (SiOxN) with refractive index of 1.45. In another example, the waveguide element 420 is made of silicon oxynitride with refractive index of 1.60 and the first, second and third cladding layers 320, 340, 360 are made of silicon dioxide with refractive index of 1.5.

Furthermore, the waveguide element 420 can be made to operate in single-mode or multi-mode. Depending on the mode of operation, the width ($w_W$) of the waveguide element 420 may range from 0.1 μm to 10 μm, and the thickness or height ($h_W$) of the waveguide element 420 may range from 0.1 μm to 0.5 μm. Furthermore, the dimensions of the width ($w_W$) and height ($h_W$) also depends on the index contrast of the waveguide element 420 and the range of wavelength used for the light. Waveguide element 420 may be used to receive light with wavelengths in the range of 400 nm to 1700 nm.

The photodetector element 520 is disposed on the waveguide element 420 and encapsulates the top surface 440 and portions 462, 472 of the sidewalls 460, 470 of waveguide element 420 so as to achieve a high coupling efficiency between the photodetector element 520 and waveguide element 420. A high coupling efficiency enables the waveguide photodetector device to operate with higher responsivity. Photodetector element 520 is selected from a group of materials capable of detecting or absorbing light from the waveguide element 420 and in response, generates an electrical signal based on the amount of light detected or absorbed.

In one embodiment, the photodetector element 520 is made from a material with a higher refractive index than the waveguide element 420 so as to effectively absorb maximum amount of light from the waveguide element 420. In one embodiment, photodetector element 520 is made of an intrinsic (i.e. undoped) semiconductor material such as but not limited to polycrystalline silicon with a refractive index of 3.5, polycrystalline germanium with a refractive index of 4.0 or gallium arsenide with a refractive index of 3.8. For example, to obtain a high index contrast, photodetector element 520 is made of polycrystalline germanium with refractive index of 4.0 when the waveguide element 420 is made of silicon with refractive index of 3.5 or silicon nitride with refractive index of 2.0. In another example, photodetector element 520 is made of polycrystalline silicon with refractive index of 3.5 or gallium arsenide with refractive index of 3.8 when the waveguide element 420 is made of silicon nitride with refractive index of 2.0.

In FIG. 3, thickness or height ($h_D$) of the photodetector element 520 may range from 0.1 μm to 1.0 μm and the width ($w_D$) in the range of 0.5 μm to 20 μm. Referring to FIG. 2, photodetector element 520 has a length ($l_D$) in the range of 1.0 μm to 5.0 μm. Furthermore, photodetector element 520 can absorb light with wavelengths in the range of 400 nm to 1700 nm.

In FIG. 3, the waveguide photodetector device further comprises metal contacts 622, 624 disposed within the third cladding layer 360, wherein the metal contacts 622, 624 are coupled to opposite sides of the photodetector element 520. Metal contacts are made of metal or metal alloy materials, such as but not limited to aluminum (Al), chromium (Cr), platinum (Pt), gold (Au), nickel (Ni), silver (Ag), tungsten (W), titanium (Ti), tantalum (Ta) and copper (Cu).

Waveguide photodetector device can be fabricated as a metal-semiconductor-metal (MSM) type of photodetector or p-i-n type of photodetector. In one embodiment, the waveguide photodetector device is a MSM photodetector type having metal contacts 622, 624 with a work function in the range of 4.25 eV to 5.3 eV. A bias voltage of 1V is provided across the metal contacts 622, 624.

In the case where the waveguide photodetector device is a p-i-n photodetector type, the photodetector element 520 comprises doped regions 532, 534 formed with opposite conductivity types in opposite sides of the photodetector element 520 as shown in FIG. 3. For example, if doped region 532 is formed as a p-type region, then doped region 534 is formed as a n-type region. N-type dopants such as phosphorus, arsenic and antimony are used to form a n-type region. P-type dopants such as boron and gallium are used to form a p-type region. Portions of the photodetector element 520 between the doped regions 532, 534 remains as an intrinsic region (i.e. undoped region). Furthermore, metal contact 622 is coupled to doped region 532 whereas metal contact 624 is coupled to doped region 534. In one embodiment, a bias voltage of 1V can be applied across the metal contacts 622, 624.

Figure 4:
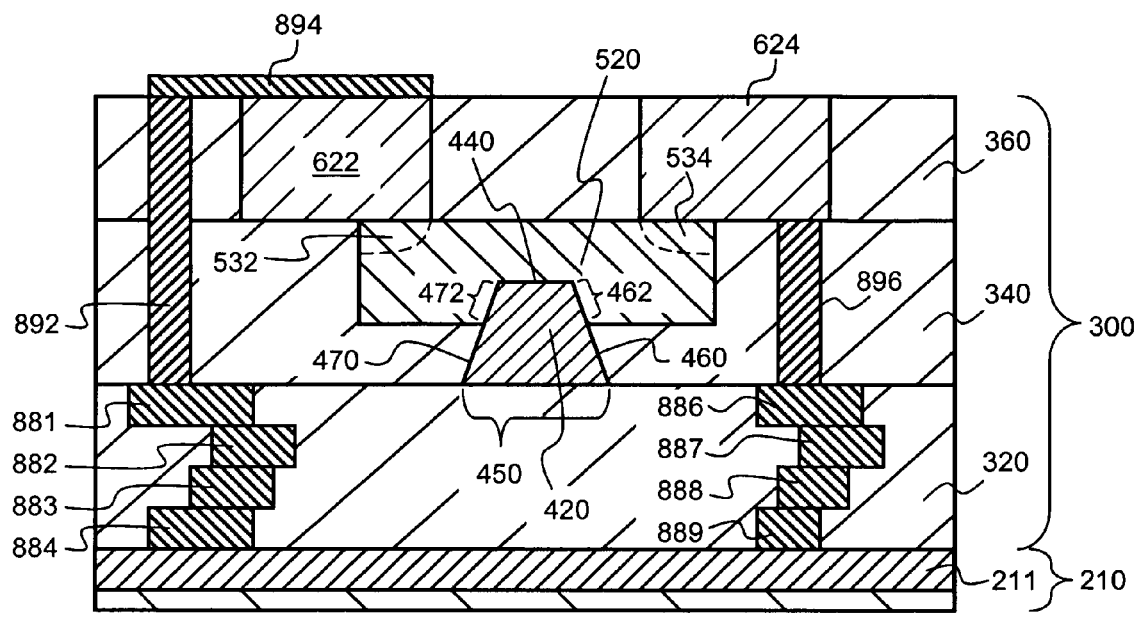
FIG. 4 is a cross-sectional view of the waveguide photodetector device in accordance with another embodiment of the present invention.

In an embodiment of the present invention, the first cladding layer 320 is a multi-layered dielectric structure comprising a first stack of metal interconnects 881, 882, 883, 884, and a second stack of metal interconnects 886, 887, 888, 889 as illustrated in FIG. 4. The first stack of metal interconnects 881, 882, 883, 884, and second stack of metal interconnects 886, 887, 888, 889 are made of metal or metal alloy materials, such as but not limited to aluminum (Al), titanium (Ti), copper (Cu) and tungsten (W). Furthermore, the base semiconductor layer 210 comprises a layer of active devices 211 that is coupled to the first stack of metal interconnects 881, 882, 883, 884, and second stack of metal interconnects 886, 887, 888, 889. In one embodiment, the layer of active devices 211 includes devices such as but not limited to transistors, rectifiers, isolation structures and capacitors that are formed as part of an integrated circuit.

The waveguide photodetector device in FIG. 4 further comprises a through-hole interconnect 892 and interconnect 894 that couples the metal contact 622 to the first stack of metal interconnects 881, 882, 883, 884. The topmost conductive element 881 of the first stack of metal interconnects 881, 882, 883, 884 is coupled to the through-hole interconnect 892 that extends through the second and third cladding layers 340, 360. Interconnect 894 is disposed on the metal contact 622 and couples the through-hole interconnect 892 to the metal contact 622. In one embodiment, the through-hole interconnect 892 and interconnect 894 are made of metal or metal alloy materials, such as but not limited to aluminum (Al), titanium (Ti), copper (Cu) and tungsten (W).

A buried interconnect 896 couples the second stack of metal interconnects 886, 887, 888, 889 to the metal contact 624. Buried interconnect 896 extends through the second cladding layer 340 and couples the topmost metal interconnect 886 of the second stack of metal interconnects 886, 887, 888, 889 to the metal contact 624. In one embodiment, the buried interconnect 896 is made of metal or metal alloy materials, such as but not limited to aluminum (Al), titanium (Ti), copper (Cu) and tungsten (W).

For illustration purposes, FIG. 4 illustrates the coupling of the layer of active devices 211 to the metal contacts 622, 624 using a combination of through-hole interconnect 892 and buried interconnect 896. However, depending on the configuration of the first and second stack of conductive elements, it can be appreciated that layer of active devices 310 can be coupled to the metal contacts 622, 624 using only through-hole interconnects, using only buried interconnects or using other types of interconnects.

Figure 5:
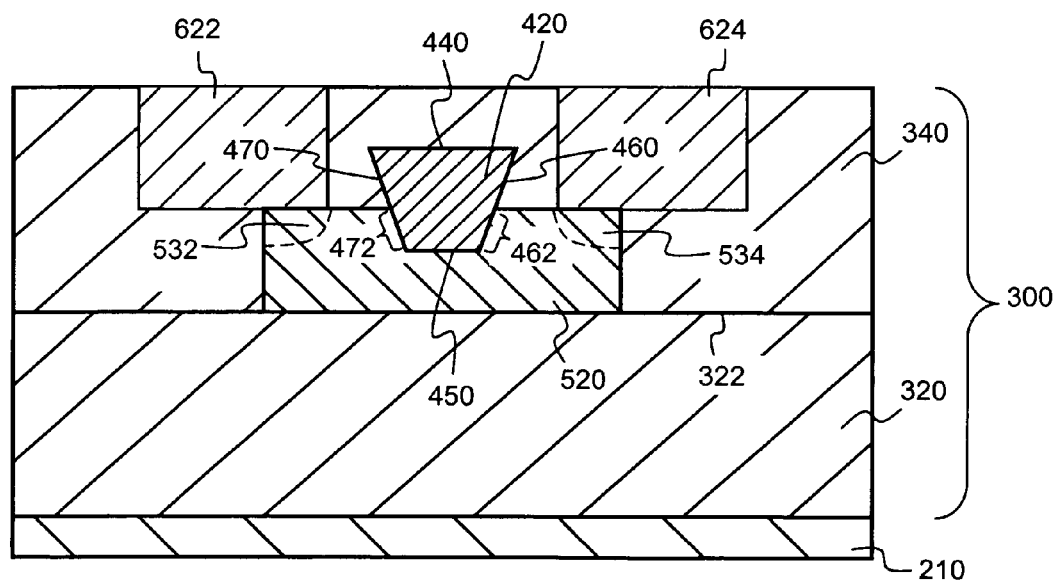
FIG. 5 is a cross-sectional view of the waveguide photodetector device in accordance with yet another embodiment of the present invention.

FIG. 5 illustrates a waveguide photodetector device fabricated in accordance with another embodiment of the present invention. Similarly, the waveguide element 420 and photodetector element 520 is disposed with the cladding structure 300. In an embodiment of the present invention, the cladding structure 300 in FIG. 5 comprises the first cladding layer 320 and second cladding layer 340. The first and second cladding layers 320, 340 can be made from the same type of materials as discussed in relation to FIG. 3.

In an embodiment of the present invention, both the waveguide element 420 and photodetector element 520 are disposed within the second cladding layer 340. The waveguide element 420 includes a top surface 440, a bottom surface 450 and sidewalls 460, 470 extending from the top surface 440 to the bottom surface 450. In particular, the waveguide element 420 is formed on top of the photodetector element 520 such that the top surface 440 and portions 462, 472 of the sidewalls 460, 470 of waveguide element 420 are encapsulated by the photodetector element 520. Waveguide element 420 and photodetector element 520 uses the same type of materials as discussed in FIG. 3.

In FIG. 5, the waveguide photodetector device further comprises metal contacts 622, 624 disposed within the second cladding layer 340, wherein the metal contacts 622, 624 are coupled to opposite sides of the photodetector element 520. Metal contacts are made from the same type of materials as discussed in FIG. 3.

Waveguide photodetector device can be fabricated as a metal-semiconductor-metal (MSM) type of photodetector or p-i-n type of photodetector as previously discussed in FIG. 3 and is applicable to FIG. 5. In the case where the waveguide photodetector device is a MSM photodetector type, metal contacts 622, 624 have a work function in the range of 4.25 eV to 5.3 eV. In the case where the waveguide photodetector device is a p-i-n photodetector type, the photodetector element 520 comprises doped regions 532, 534 formed with opposite conductivity types in opposite sides of the photodetector element 520 as shown in FIG. 5.

Generally, a typical optical link comprises a transmitting device coupled to a receiving device via an optical medium such as a waveguide. In one embodiment, the waveguide photodetector device is used in an optical interconnect as part of the receiving device of an optical link. For example, in FIG. 2, the first end 422 of the waveguide element 420 is coupled to a transmitting device (not shown), such as a light emitting device (LED) or laser, to receive an input light containing an optical signal from the transmitting device. The waveguide element 420 then guides or directs the input light containing the optical signal from the first end 422 to the second end 424. Photodetector element 520 then detects the optical signal from the waveguide element 420 and generates an electrical signal based on the optical signal. The electrical signal is then transmitted by the photodetector element 520 to other devices (not shown) through the metal contacts 622, 624.

In an embodiment of the present invention, the waveguide photodetector device as illustrated in FIG. 3 can be used as a standalone optical interconnect for coupling active devices in a single chip (on-chip) or in separate chips (chip-to-chip).

In another embodiment of the present invention, the waveguide photodetector device shown in FIG. 4 can be used as an integrated optical interconnect in an integrated circuit. Based on the optical signal received from the waveguide element 420, the photodetector element 520 generates an electrical signal which is then transmitted to the layer of active devices 211 via metal contacts 622, 624, interconnects 892, 894, 896 and the first and second stack of metal interconnects 881, 882, 883, 884, 886, 887, 888, 889.

Figure 6A:
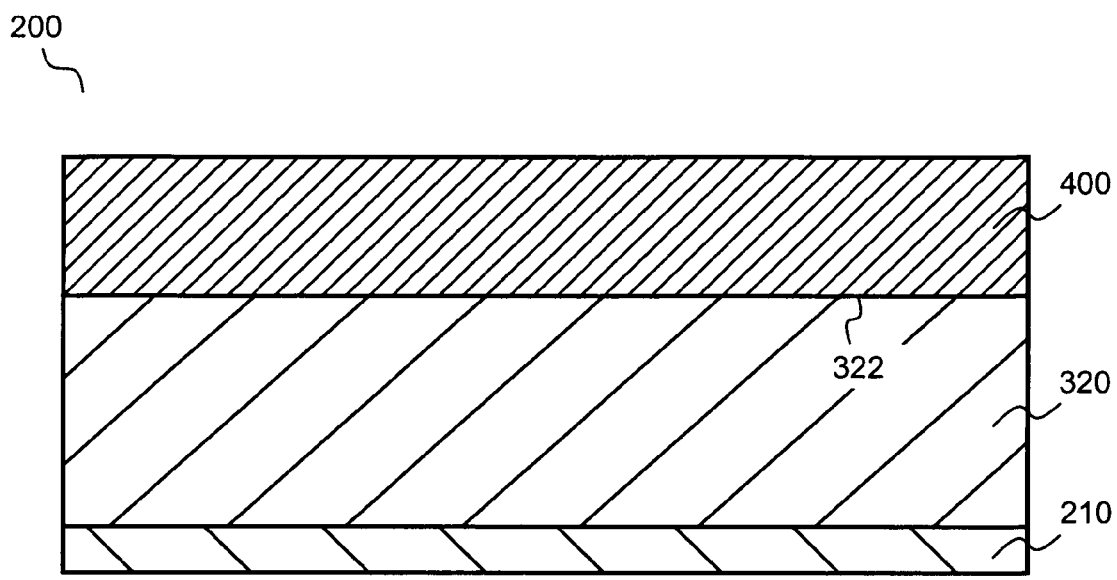
FIGS. 6A-6J illustrate a method of forming the waveguide photodetector device as shown in FIG. 3.

FIGS. 6A-6J illustrate a method of forming the waveguide photodetector device as shown in FIG. 2 according to one embodiment of the present invention. The fabrication of the waveguide photodetector device begins by forming a waveguide element on a substrate 200 as shown in FIG. 6A. In an embodiment of the present invention, the substrate 200 comprising a layer of waveguide material 400 formed onto a first cladding layer 320 that is disposed on a base semiconductor layer 210.

In one embodiment, the substrate 200 is formed by first depositing the first cladding layer 320 on the base semiconductor layer 210 using well known techniques such as but not limited to chemical vapor deposition (CVD), physical vapor deposition (PVD) and atomic layer deposition (ALD). As discussed earlier in relation to FIG. 3, the base semiconductor layer 210 is made of monocrystalline silicon. In one embodiment, the base semiconductor layer 210 comprises a layer of active devices having devices such as but not limited to transistors, rectifiers, isolation structures and capacitors. In one embodiment, first cladding layer 320 is made of an oxide compound material, such as but not limited to silicon dioxide with a refractive index of 1.5.

The layer of waveguide material 400 is then blanket deposited on the top surface 322 of the first cladding layer 320 using well know deposition techniques such as but not limited to CVD, PVD and ALD. The layer of waveguide material 400 is made of a material that enables propagation of light therein. In one embodiment, the layer of waveguide material 400 is made of a material with a higher refractive index than the first cladding layer 320. For example, the layer of waveguide material 400 is made from materials, such but not limited to, silicon (Si) with a refractive index of 3.5 or silicon nitride (SiN) with a refractive index of 2.0.

In one embodiment, the substrate 200 is a silicon on insulator (SOI) substrate such that the layer of waveguide material 400 is the topmost silicon film of the SOI substrate. Furthermore, the first cladding layer 320 is the buried oxide layer of the SOI substrate, and base semiconductor layer 210 is the silicon substrate of the SOI substrate. The SOI substrate is formed by well known techniques such as but not limited to a separation by implantation of oxygen (SIMOX) process or wafer bonding process.

Figure 6B:
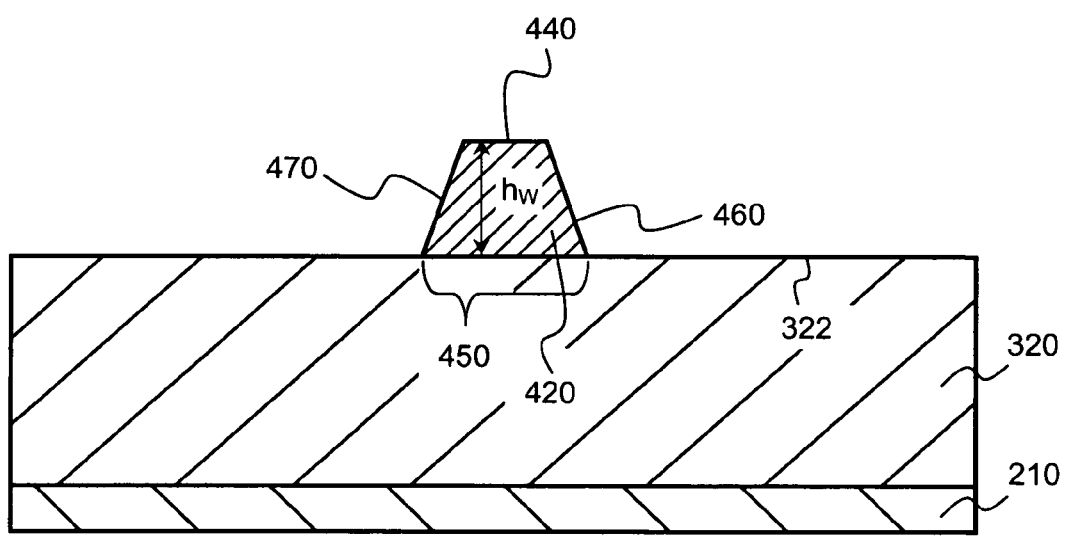

Next, the layer of waveguide material 400 is patterned using well-known photolithography and etching techniques to form the waveguide element 420 with a desired height $h_w$, as shown in FIG. 6B. Etching techniques include but are not limited to plasma etching, ion beam etching or reactive ion etching or using an etchant with a chemistry that etches the layer of waveguide material 400 but does not etch the first cladding layer 320. The waveguide element 420 includes a top surface 440, a bottom surface 450 and sidewalls 460, 470 extending from the top surface 440 to the bottom surface 450. Bottom surface 450 of waveguide element 420 is disposed on the top surface 322 of first cladding layer 320. In one embodiment, the waveguide element has a trapezoidal cross-sectional shape as discussed earlier in relation to FIG. 3.

Figure 6C:
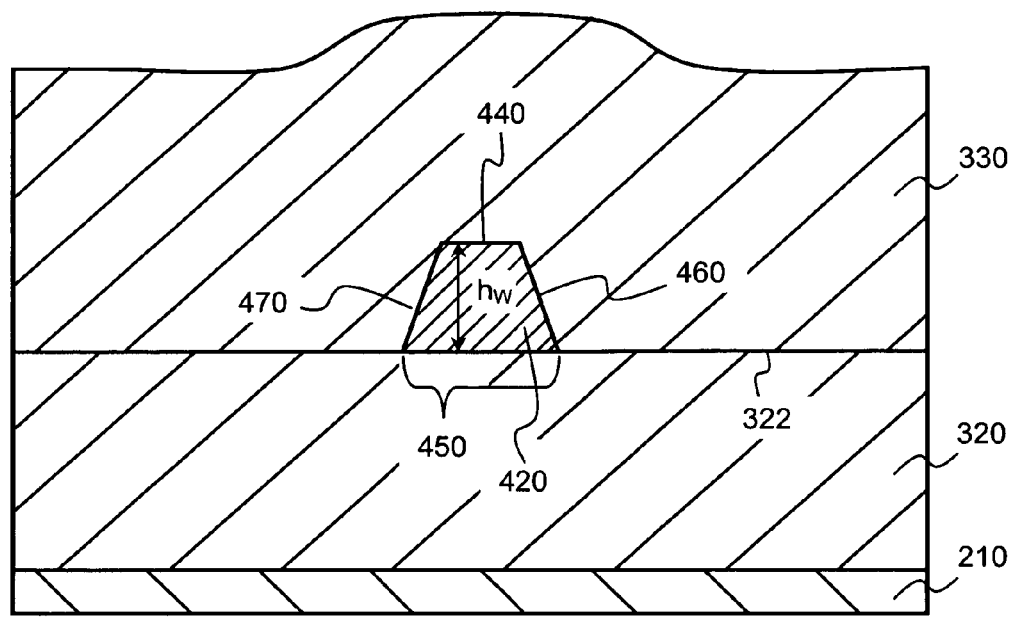

After forming the waveguide element 420, a second cladding layer is formed onto the waveguide element 420 and exposes the top surface 440 and a portion of each of the sidewalls 460, 470 of waveguide element 420. In an embodiment of the present invention, the fabrication of the second cladding layer begins by blanket depositing a layer of cladding material 330 onto the waveguide element 420 and top surface of 332 of first cladding layer 320 as shown in FIG. 6C, such that the layer of cladding material 330 encapsulates the entire top surface 440 and sidewalls 460, 470 of the waveguide element 420. The layer of cladding material 330 is deposited on the waveguide element 420 and first cladding layer 320 using well known techniques such as but not limited to CVD, PVD and ALD. The layer of cladding material 330 is made of any material having a lower refractive index than the waveguide element 420. In a specific embodiment, the layer of cladding material 330 is made of an oxide compound material, such as but not limited to silicon dioxide with a refractive index of 1.5.

Figure 6D:
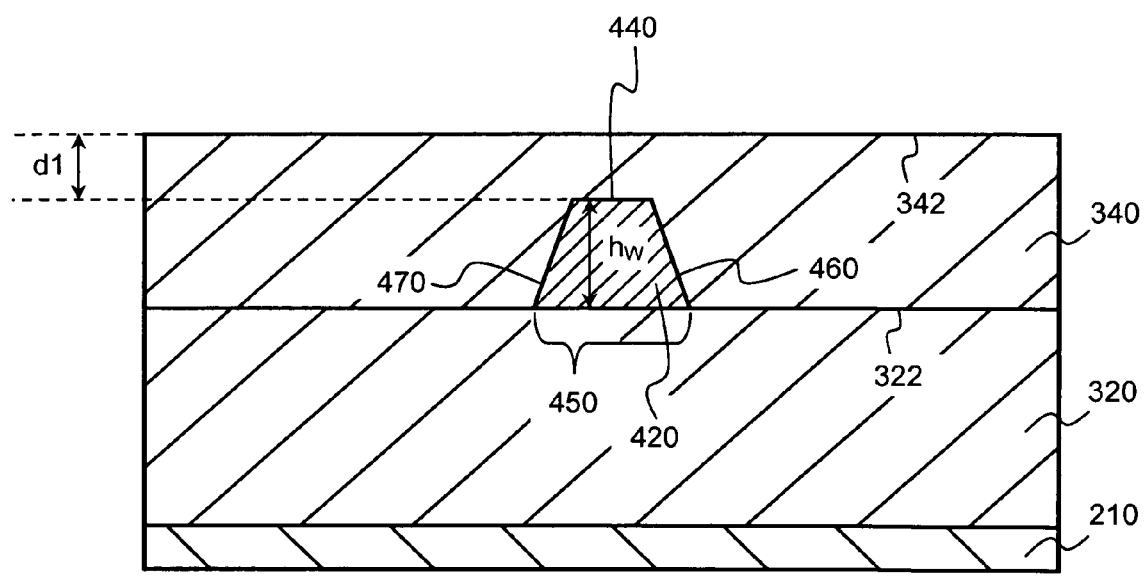

Next, the layer of cladding material 330 is planarized by using well known techniques, such as a chemical mechanical polishing (CMP) process or a plasma etch back process, to form the second cladding layer 340 as shown in FIG. 6D. In particular, the layer of cladding material 330 is planarized until the second cladding layer 340 has a top surface 342 formed at a desired distance (d1) from the top surface 440 of the waveguide element 420.

Figure 6E:
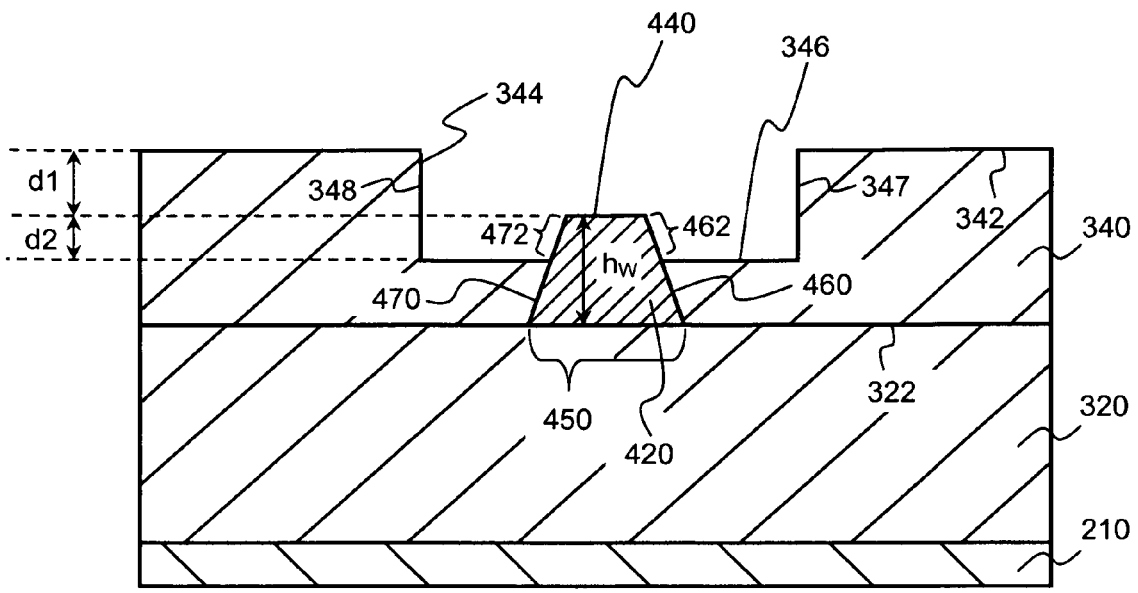
Figure 6F:
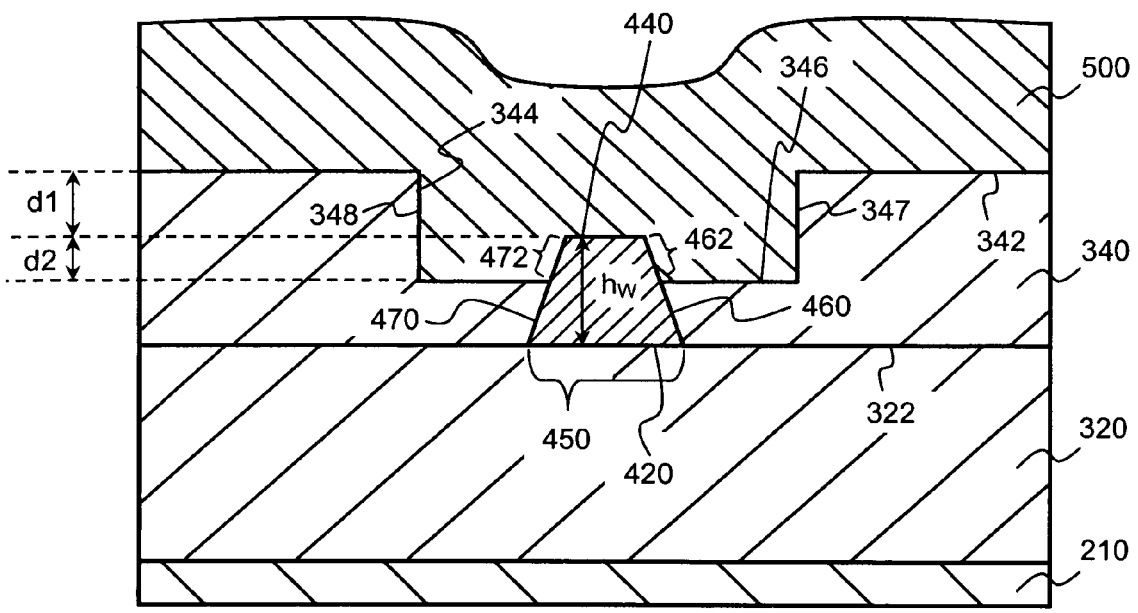

Next, in FIG. 6E, the second cladding layer 340 is patterned, using well-known photolithography and etching techniques, to remove at least a portion of the second cladding layer 340 so as to sufficiently expose the top surface 440 and portions of sidewalls 460, 470 of waveguide element 420. Etching techniques used to pattern the second cladding layer 340 include but are not limited to plasma etching, ion beam etching or reactive ion etching or using an etchant with a chemistry that etches the second cladding layer 340 but does not etch the waveguide element 420. In one embodiment, the second cladding layer 340 is etched to form a trench 344 therein, wherein the trench 344 comprises a bottom surface 346 and sidewalls 347, 348 extending from the bottom surface 346 to top surface 342 of second cladding layer 340. In particular, the etching time can be controlled so that the bottom surface 346 of the trench 344 is formed at a desired distance (d2) below the top surface 440 of the waveguide element 420. In this case, the trench 344 exposes the top surface 440, portion 462 of sidewall 460 and portion 472 of sidewall 470 of the waveguide element 420. In one embodiment, each portion 462, 472 is at least one-third the length of each sidewall 460, 470.

Next, a photodetector element is formed on the waveguide element 420 and encapsulates the top surface 440 and portions 462, 472 of waveguide element 420. In an embodiment of the present invention, the fabrication of the photodetector element begins, in FIG. 6F, by blanket depositing a layer of photodetector material 500 onto the second cladding layer 340 and the bottom surface 346 and sidewalls 347, 348 of trench 344 such that the layer of photodetector material 500 encapsulates the top surface 440 and portions 462, 472 of waveguide element 420. The layer of photodetector material 500 can be deposited using well known techniques such as but not limited to CVD, PVD and ALD. Layer of photodetector material 500 is selected from a group of materials capable of detecting or absorbing light from the waveguide element 420 and in response, generates an electrical signal based on the amount of light detected or absorbed. In one embodiment, the layer of photodetector material 500 is made with a material with a higher refractive index than the waveguide element 420 so as to effectively absorb maximum amount of light from the waveguide element 420. In one embodiment, layer of photodetector material 500 is made of an intrinsic semiconductor material such as but not limited to polycrystalline silicon with a refractive index of 3.5, polycrystalline germanium with a refractive index of 4.0 or gallium arsenide with a refractive index of 3.8. To obtain a high index contrast, polycrystalline germanium (refractive index of 4.0) can be used for the layer of photodetector material 500 when the waveguide element 420 is made of silicon (refractive index of 3.5) or silicon nitride (refractive index of 2.0). On the other hand, polycrystalline silicon (refractive index of 3.5) or gallium arsenide (refractive index of 3.8) can be used for the layer of photodetector material 500 when the waveguide element 420 is made of silicon nitride (refractive index of 2.0).

Figure 6G:
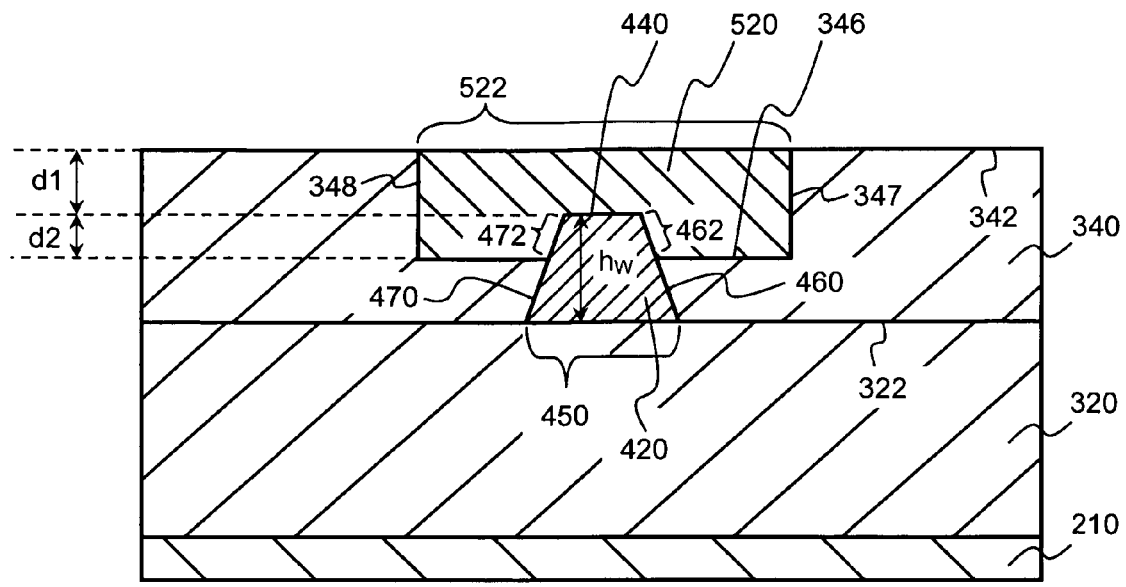

Next, the layer of photodetector material 500 is planarized to remove portions of the layer of photodetector material 500 deposited on the top surface 342 of the second cladding layer 340. Layer of photodetector material 500 is planarized using well known techniques such as a CMP process or a plasma etch back process. A portion of the layer of photodetector material 500 is left on the bottom surface 346 and sidewalls 347, 348 of trench 344 to form the photodetector element 520 as shown in FIG. 6G. Photodetector element 520 comprises a top surface 522 that is coplanar with the top surface 342 of second cladding layer 340. In particular, the photodetector element 520 encapsulates the top surface 440 and portions 462, 472 of the sidewalls 460, 470 of waveguide element 420. By encapsulating the top surface 440 and at least a portion of each of the sidewalls 460, 470 of waveguide element 420 with the photodetector element 520, the coupling efficiency between the photodetector element 520 and waveguide element 420 is improved significantly.

FIGS. 6D, 6E and 6G illustrate one embodiment of using distance d1 and distance d2 to control a desired portion of waveguide element 420 to be encapsulated by the photodetector element 520. Referring back to FIG. 6D, the planarizing process is performed to form the top surface 342 of second cladding layer 340 at distance d1 above the top surface 440 of waveguide element 420. Then, the etching process is performed in FIG. 6E to form the trench 344 having a bottom surface 346 at the distance d2 below the top surface 440 of waveguide element 420. At distance d2, the trench 344 exposes the top surface 440 and portions 462, 472 of waveguide element 420. Then, in FIG. 6G, the planarizing process is performed on the layer of photodetector material 500 to form the photodetector element 520, which encapsulates the top surface 440 and portions 462, 472 of waveguide element 420. Thus, both distance d1 and distance d2 are variable parameters that can be used to control the amount or portion of waveguide element 420 to be encapsulated by the photodetector element 520. By controlling the portion of waveguide element 420 to be encapsulated by the photodetector element 520, the coupling between the waveguide element 420 and photodetector element 520 can be optimized to attain higher speed and responsivity for the waveguide photodetector device.

In one embodiment of the present invention, the top surface 440 and entire sidewalls 460, 470 of waveguide element 420 can be fully encapsulated by the photodetector element 520 by adjusting distance d2 to be equivalent to the height ($h_W$) of the waveguide element 420. In order to achieve a distance d2 that is equivalent to height ($h_W$), the trench 344 in FIG. 6E can be further etched until the bottom surface 346 of trench 344 is coplanar with the bottom surface 450 of waveguide element 420. Distance d1 may also be adjusted to control the amount of photodetector element 520 on top of the waveguide element 420. Then, the photodetector element 520 is formed onto the waveguide element 420 using the processes as described in FIGS. 6F and 6G.

In another embodiment, the distance d2 is reduced to almost zero so that the photodetector element 520 is formed on the top surface 440 of waveguide element 420. By reducing the etching time used to form the trench 344 in FIG. 6E, the trench 344 can be formed to expose the top surface 440 of the waveguide element 420 without exposing much of the sidewalls 460, 470. Furthermore, distance d1 can be adjusted by controlling the planarizing process in FIG. 6D so as to ensure that there is sufficient amount of photodetector element 520 for absorbing light from the top surface 440 of waveguide element 420. Photodetector element 520 is then formed onto the waveguide element 420 using the processes as described in FIGS. 6F and 6G In yet another embodiment, the planarizing process in FIG. 6G can be used to achieve the distance d1 instead of using the planarizing process in FIG. 6D. The layer of cladding material 330 in FIG. 6C is planarized to form the second cladding layer 340 with a top surface 342 at a distance greater than distance d1 above the top surface 440 of waveguide element 420. Then, the etching process in FIG. 6E is performed to obtain the distance d2. At FIG. 6F, the planarizing process of layer of photodetector material 500 is performed until the top surface 522 of photodetector element 520 is formed at the distance d1 from the top surface 440 of waveguide element 420.

Figure 6H:
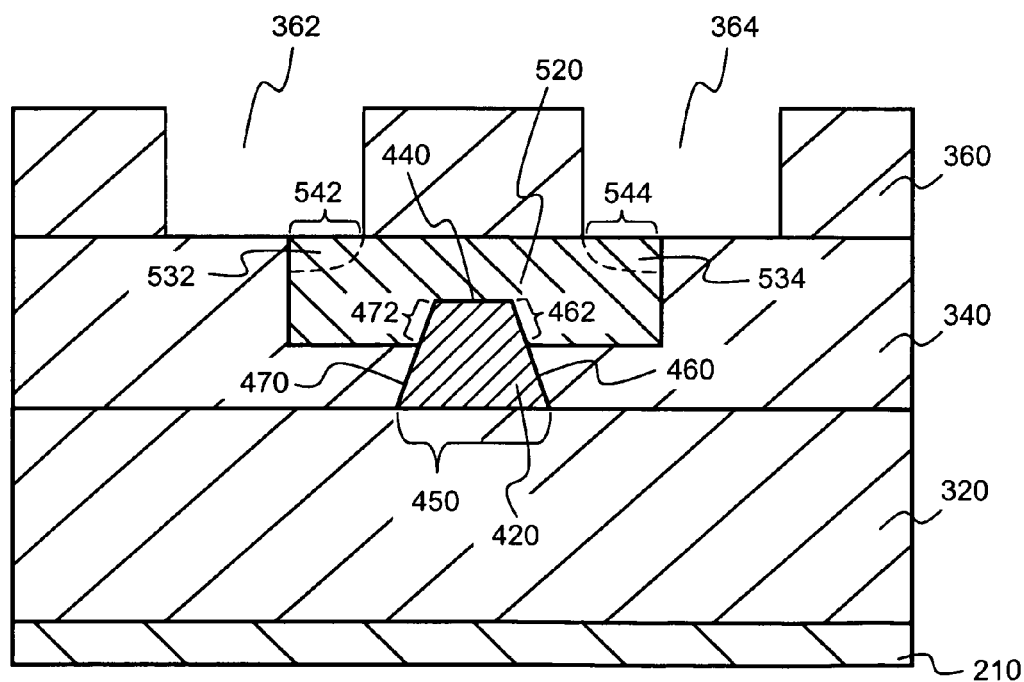

Continuing from FIG. 6G, metal contacts are then formed on the photodetector element 520. In an embodiment of the present invention, the fabrication of the metal contacts begins by forming a third cladding layer 360 on the second cladding layer 340 and photodetector element 520 as shown in FIG. 6H, wherein the third cladding layer 360 includes openings 362, 364 formed therein.

In one embodiment, the third cladding layer 360 with openings 362, 364 is formed by first blanketing depositing the third cladding layer 360 on the second cladding layer 340 using well known techniques such as but not limited to CVD, PVD and ALD. Then, etching is performed on the third cladding layer 360 to form the openings 362, 364, wherein the opening 362 exposes region 542 on the photodetector element 520, and opening 364 exposes region 544 on the photodetector element 520. Etching techniques used to form the openings 362, 364 include but are not limited to plasma etching, ion beam etching or reactive ion etching or using an etchant with a chemistry that etches the third cladding layer 360 but does not etch the photodetector element 520. The third cladding layer 360 is made of any material having a lower refractive index than the waveguide element 420. In a specific embodiment, the third cladding layer 360 is made of an oxide compound material, such as but not limited to silicon dioxide with a refractive index of 1.5.

As discussed in relation to FIG. 3, waveguide photodetector device can be fabricated as a metal-semiconductor-metal (MSM) type of photodetector or p-i-n type of photodetector. In the case where the waveguide photodetector device is a p-i-n photodetector type, doped regions are formed in the photodetector element 520.

In one embodiment, doped regions having opposite conductivity type are formed in opposite sides of the photodetector element 520 using well known techniques, such as but not limited to ion implantation. Referring to FIG. 6H, opening 362 in the third cladding layer 360 can be formed first without forming the opening 364. Then, the region 542 of the photodetector element 520 is exposed to a p-type dopant, such as boron or gallium to form a p-type region 532 in the photodetector element 520. Next, the opening 362 is covered by a mask (not shown) and opening 364 is formed in the third cladding layer 360 to expose region 544 on the photodetector element 520. Region 544 is then exposed to a n-type dopant, such as phosphorus, arsenic or antimony to form a n-type region 534 in the photodetector element 520. Portions of the photodetector element 520 between the doped regions 532, 534 remains as an intrinsic region (i.e. undoped region). It can be appreciated that region 532 can be formed as a n-type and region 534 can be formed as a p-type. Subsequently, the mask on the opening 362 is removed and continues with the fabrication of metal contacts in openings 362, 364.

Figure 6I:
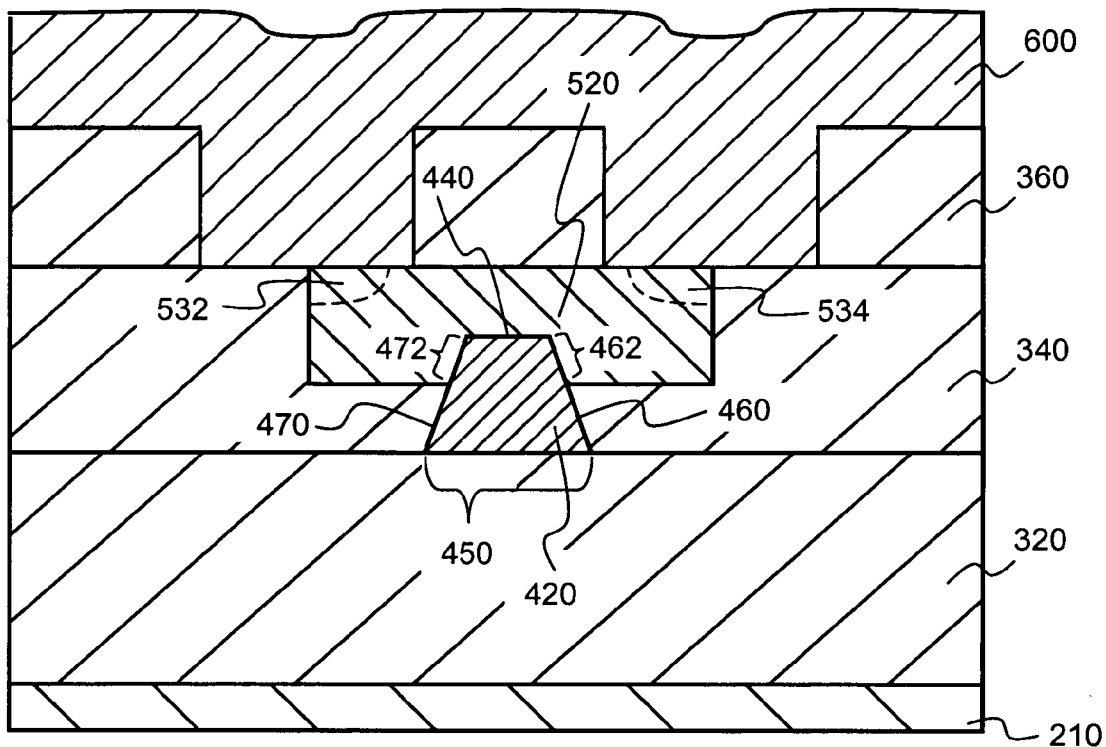
Figure 6J:
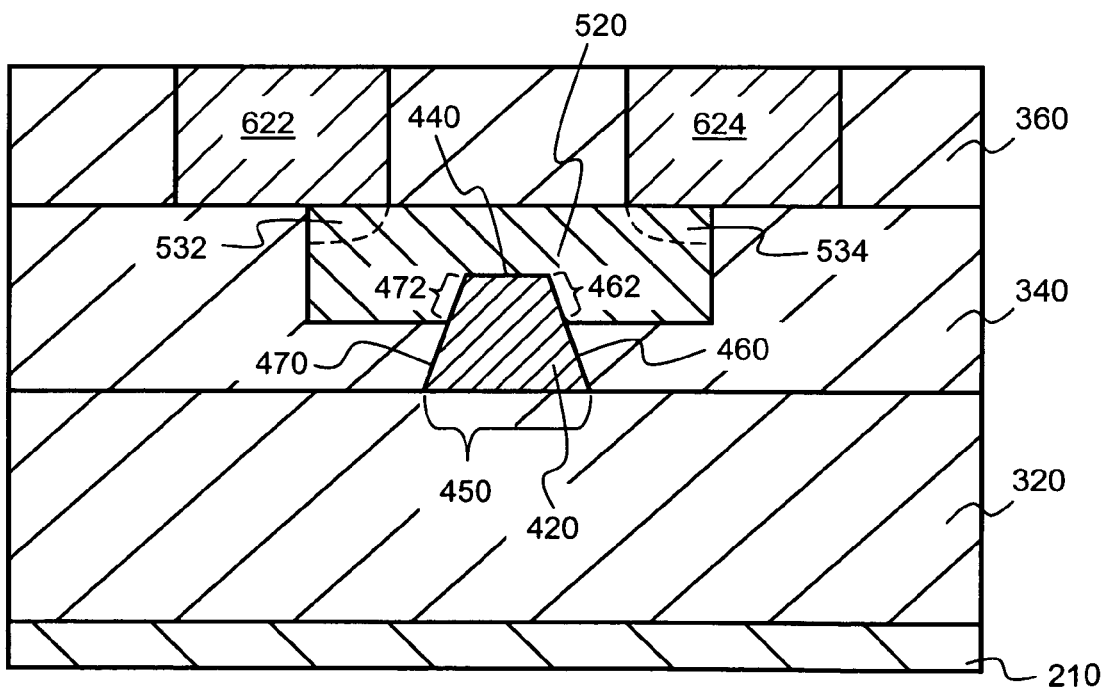

Next, metal contacts are formed in the openings 362, 364 of the third cladding layer 360. In one embodiment, a metal layer 600 is blanket deposited on the third cladding layer 360, as shown in FIG. 6I, by well know methods such as but not limited to CVD, PVD or evaporation. In one embodiment, metal layer 600 is made of metal or metal alloy materials, such as but not limited to aluminum (Al), chromium (Cr), platinum (Pt), gold (Au), nickel (Ni), silver (Ag) and tungsten (W). The metal layer 600 is then planarized using well known techniques such as CMP or plasma etch back to form metal contacts 622, 624 in the third cladding layer 360 as shown in FIG. 6J.

In another embodiment, the metal contacts 622,624 are formed by selective deposition into the openings 362, 364 of the third cladding layer 360. Beginning from FIG. 6H, metal layers are selectively deposited, using well known methods such as electrolysis deposition, into openings 362, 364 to form the metal contacts 622, 624 as shown in FIG. 6J.

In the case where the waveguide photodetector device is a MSM photodetector type, doped regions 532, 534 are not formed in the photodetector element 520. Instead, metal contacts 622, 624 are formed with materials having a work function in the range of 4.25 eV to 5.3 eV.

The method described in relation to FIGS. 6A-6J can also be used to fabricate the waveguide photodetector device shown in FIG. 4. In this case, the first cladding layer 320 in FIGS. 6A-6J is now the multi-layer dielectric structure comprising the first stack of metal interconnects 881, 882, 883, 884, and the second stack of metal interconnects 886, 887, 888, 889 as illustrated in FIG. 4. Base semiconductor layer 210 comprises a layer of active devices 211 that is coupled to the first stack of metal interconnects 881, 882, 883, 884, and second stack of metal interconnects 886, 887, 888, 889. In one embodiment, the layer of active devices 211 includes devices such as but not limited to transistors, rectifiers, isolation structures and capacitors that are formed as part of an integrated circuit.

The buried interconnect 896 can be fabricated in FIG. 6H, wherein a buried via or opening (not shown) is formed in the second cladding layer 340 before depositing the buried interconnect 896 into the buried via. Next, in FIG. 6J, the through-hole interconnect 892 can be formed by first creating a through-hole via (not shown) extending through the second cladding layer 340 and third cladding layer 360. Then the through-hole interconnect 892 is deposited into the through-hole via. Interconnect 894 is then formed on the third cladding layer 360 and couples the through-hole interconnect 892 to metal contact 622.

FIGS. 6A-6J illustrate one method of fabricating the waveguide photodetector device and in particular, a method to control a desired amount of waveguide element 420 to be encapsulated by the photodetector element 520. FIGS. 7A-7J illustrate another method of controlling the desired amount of waveguide element 420 that is to be encapsulated by the photodetector element 520.

Figure 7A:
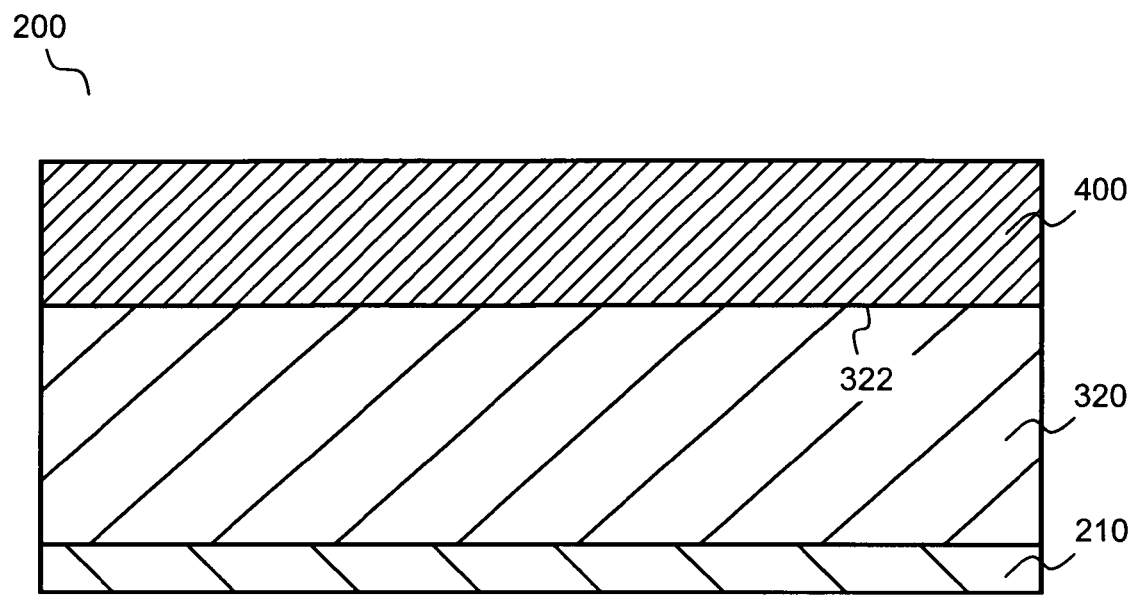
FIGS. 7A-7J illustrate a method of forming the waveguide photodetector device in accordance with another embodiment of the present invention.
Figure 7B:
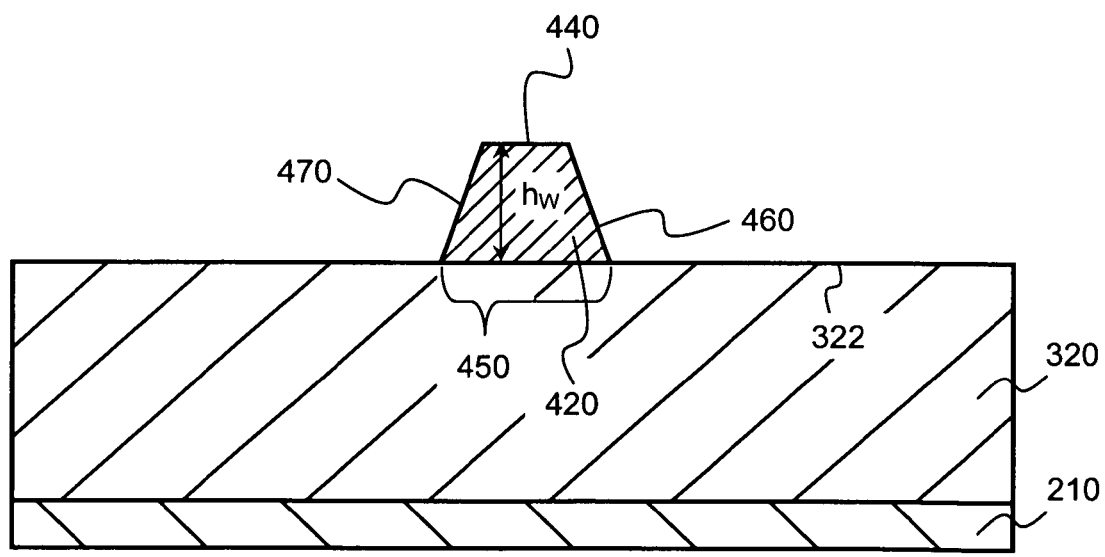

The fabrication of the waveguide photodetector device in FIGS. 7A-7J begins by forming a waveguide element on a substrate 200. The method of forming the waveguide element is similar to that as shown in FIGS. 6A-6C, and thus will not be discussed in detail. Briefly, the fabrication of the waveguide element begins with the substrate 200 comprising the layer of waveguide material 400 formed onto the first cladding layer 320 on the base semiconductor layer 210 as shown in FIG. 7A. Next, the layer of waveguide material 400 is patterned to form the waveguide element 420 with a desired height $h_W$, as shown in FIG. 7B. Waveguide element 420 includes top surface 440, bottom surface 450 and sidewalls 460, 470 extending from the top surface 440 to the bottom surface 450. Bottom surface 450 of waveguide element 420 is disposed on the top surface 322 of first cladding layer 320.

Figure 7C:
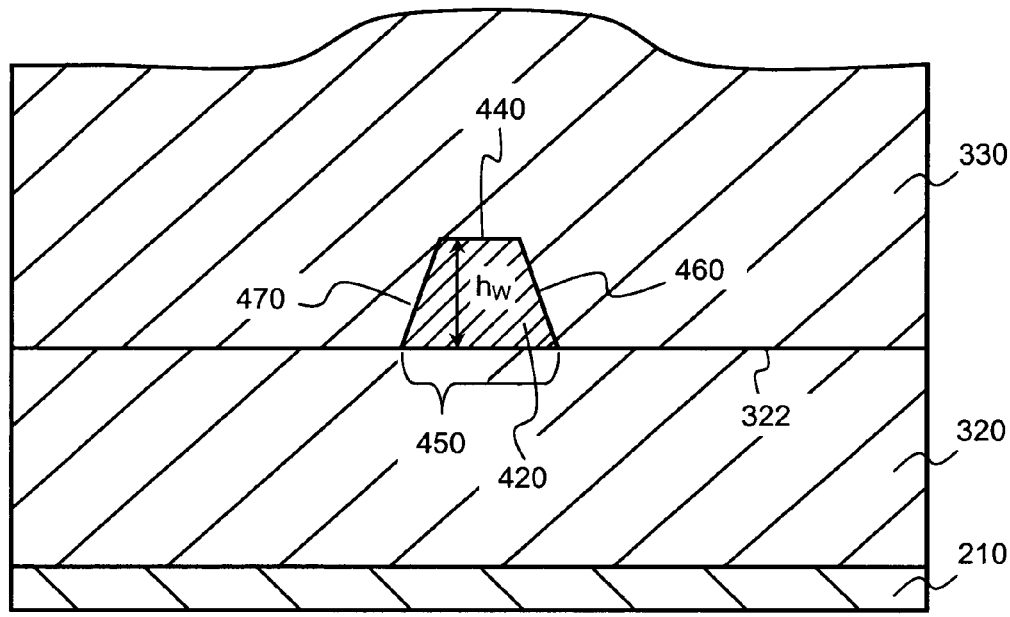

After forming the waveguide element 420, a second cladding layer is formed on the waveguide element 420, which exposes the top surface 440 and a portion of the sidewalls 460, 470 of waveguide element 420. Similar to FIG. 6C, the fabrication of the second cladding layer begins by blanket depositing the layer of cladding material 330 onto the waveguide element 420 and top surface of 322 of first cladding layer 320 as shown in FIG. 7C, such that the layer of cladding material 330 encapsulates the entire top surface 440 and sidewalls 460, 470 of the waveguide element 420.

Figure 7D:
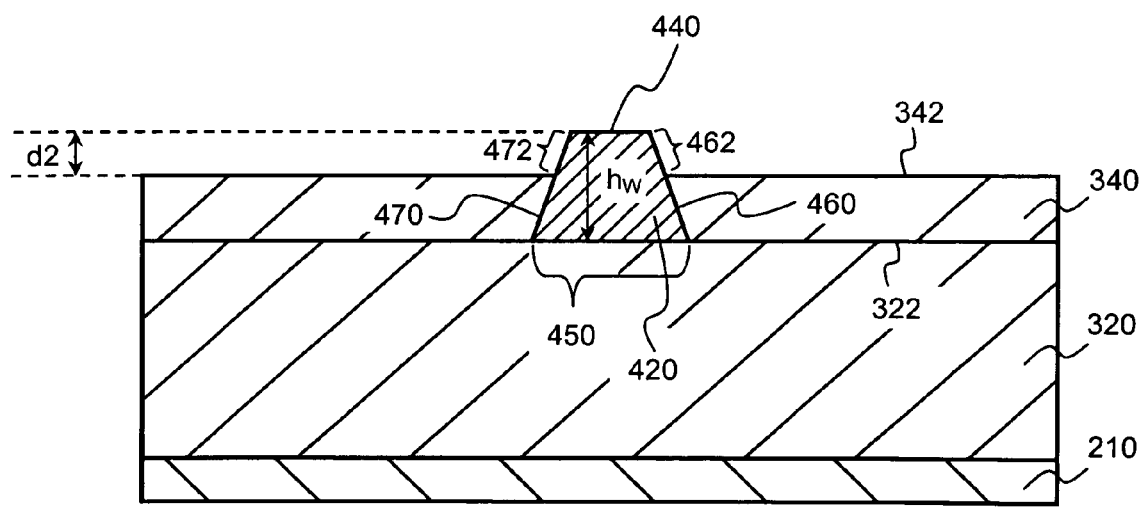
Figure 7E:
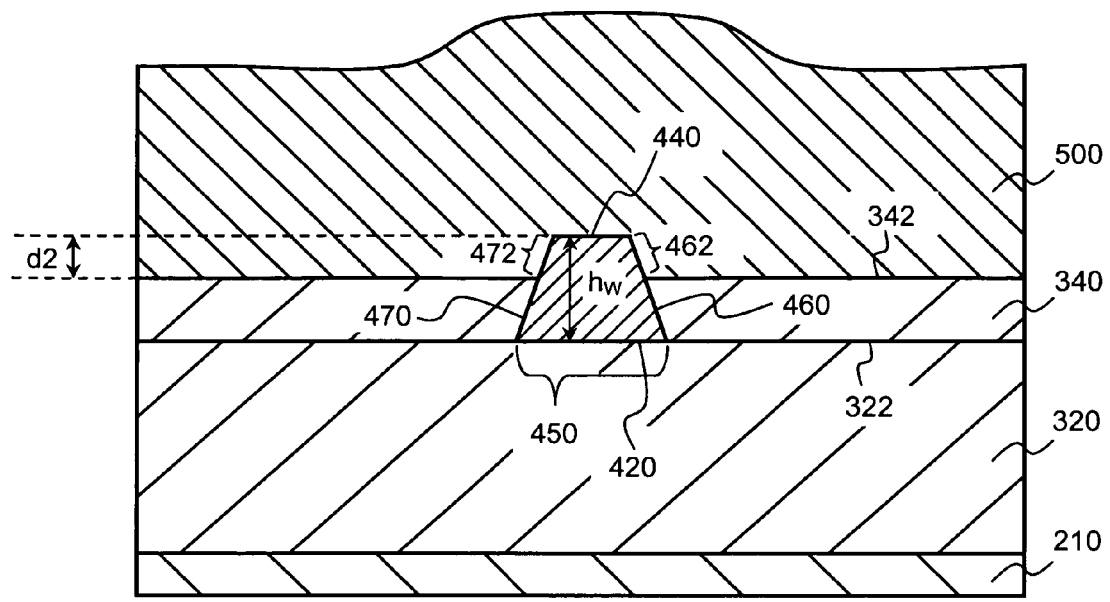

Next, the layer of cladding material 330 is etch-back to form a second cladding layer 340 that exposes the top surface 440, portion 462 of sidewall 460 and portion 472 of sidewall 470 of waveguide element 420 as shown in FIG. 7D. The etch-back process uses well known techniques, such as but not limited to plasma etching, ion beam etching or reactive ion etching or using an etchant with a chemistry that etches the layer of cladding material 330 but does not etch the waveguide element 420 (i.e. is selective to the waveguide element 420). In particular, the second cladding layer 340 comprises a top surface 342 that is formed at the distance d2 below the top surface 440 of waveguide element 420. In one embodiment, each portion 462, 472 is at least one-third the length of each sidewall 460, 470.

Next, a photodetector element is formed on the waveguide element 420 and encapsulates the top surface 440 and portions 462, 472 of waveguide element 420. In an embodiment of the present invention, the fabrication of the photodetector element begins, in FIG. 7E, by blanket depositing a layer of photodetector material 500 onto the second cladding layer 340 and waveguide 420 such that the layer of photodetector material 500 encapsulates the top surface 440 and portions 462, 472 of waveguide element 420. The layer of photodetector material 500 is deposited using well known techniques such as but not limited to chemical vapor CVD, PVD and ALD. Layer of photodetector material 500 is made of the same type of materials as discussed in relation to FIG. 6F and thus not discussed in detail here.

Subsequently, the layer of photodetector material 500 is planarized to form a processed layer of photodetector material 510 having a top surface 512 at the distance d1 above the top surface 440 of waveguide element 420. Layer of photodetector material 500 is planarized using well known techniques such as a CMP process or a plasma etch back process.

Figure 7F:
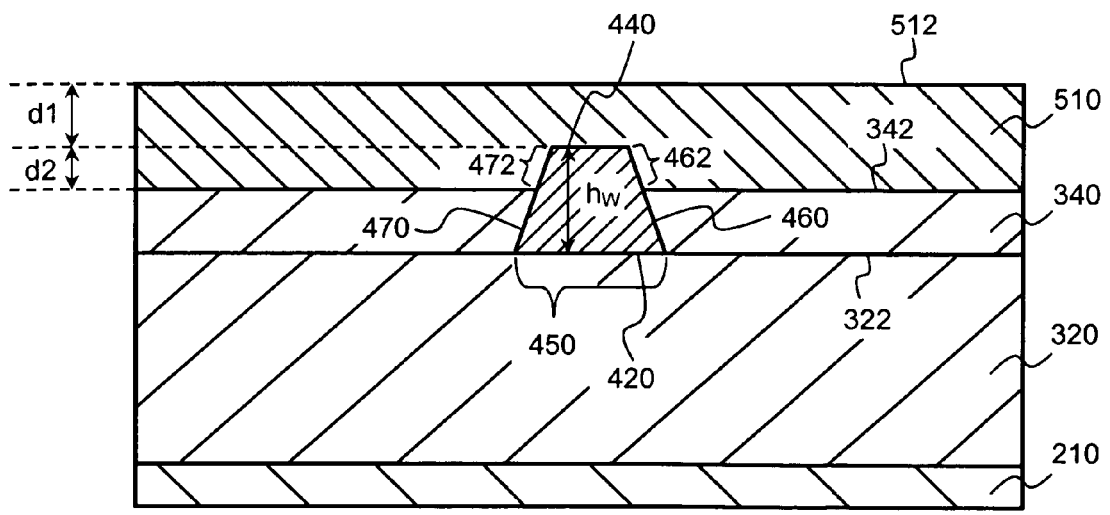
Figure 7G:
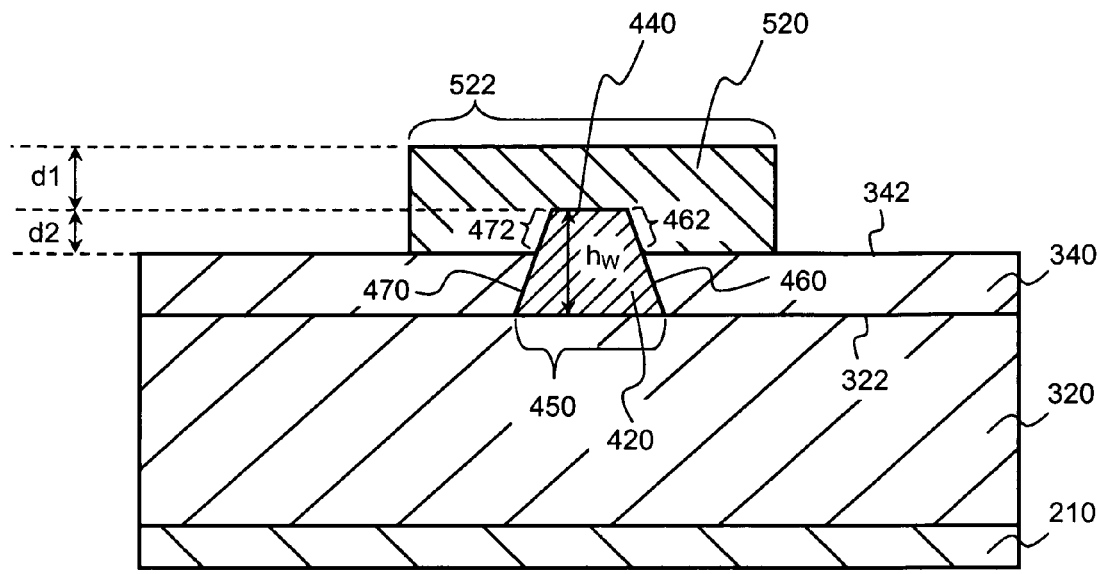

Next, the processed layer of photodetector material 510 is patterned using well-known photolithography and etching techniques to form the photodetector element 520 as shown in FIG. 7G. Etching techniques include but are not limited to plasma etching, ion beam etching or reactive ion etching or using an etchant with a chemistry that etches the processed layer of photodetector material 510 but does not etch the second cladding layer 340. Photodetector element 520 comprises a top surface 522 formed at the distance d1 from the top surface 440 of waveguide element 420. In addition, photodetector element 520 encapsulates the top surface 440 and portions 462, 472 of waveguide element 420. By encapsulating the top surface 440 and at least a portion of each sidewalls 460, 470 of waveguide element 420 with the photodetector element 520, the coupling efficiency between the photodetector element 520 and waveguide element 420 is improved significantly.

FIGS. 7D, 7F illustrate another method of implementing distance d1 and distance d2 to control a desired portion of waveguide element 420 to be encapsulated by the photodetector element 520. Referring back to FIG. 7D, the etching process forms the second cladding layer 340 with a top surface 342 at the distance d2 below the top surface 440 of waveguide element 420. At distance d2, the second cladding layer 340 exposes the top surface 440 and portions 462, 472 of waveguide element 420. Then, the planarizing process is performed in FIG. 7F to set the distance d1 that would subsequently become the distance between the top surface 440 of waveguide element 420 and the top surface 522 of photodetector element 520 as shown in FIG. 7G. Thus, both distance d1 and distance d2 are variable parameters that can be used to control the amount or portion of waveguide element 420 to be encapsulated by the photodetector element 520. By controlling the portion of waveguide element 420 to be encapsulated by the photodetector element 520, the coupling between the waveguide element 420 and photodetector element 520 can be optimized to achieve higher speed and responsivity for the waveguide photodetector device.

In one embodiment of the present invention, the top surface 440 and entire sidewalls 460, 470 of waveguide element 420 can be fully encapsulated by the photodetector element 520 by adjusting distance d2 to be equivalent to the height ($h_w$) of the waveguide element 520. In order to achieve a distance d2 that is equivalent to height ($h_w$), the second cladding layer 340 is not formed at all and the layer of photodetector material 500 is deposited directly onto the waveguide element 420 and first cladding layer 320 in FIG. 7B. Then, the layer of photodetector material 500 is subjected to the planarizing and etching processes similar to that of FIGS. 7F and 7G to form the photodetector element 520 encapsulating the top surface 440 and entire sidewalls 460, 470 of waveguide element 420. Distance d1 may also be adjusted to control the amount of photodetector element 520 on top of the waveguide element 420.

In another embodiment, the distance d2 is reduced to almost zero so that the photodetector element 520 is formed on the top surface 440 of waveguide element 420. The etchback process performed on the second cladding layer 340 in FIG. 7D is controlled so that the top surface 342 of second cladding layer 340 is coplanar with the top surface 440 of the waveguide element 420. Furthermore, distance d1 can be adjusted by controlling the planarizing process in FIG. 7F so as to ensure that there is sufficient amount of photodetector element 520 for absorbing light from the top surface 440 of waveguide element 520.

Figure 7H:
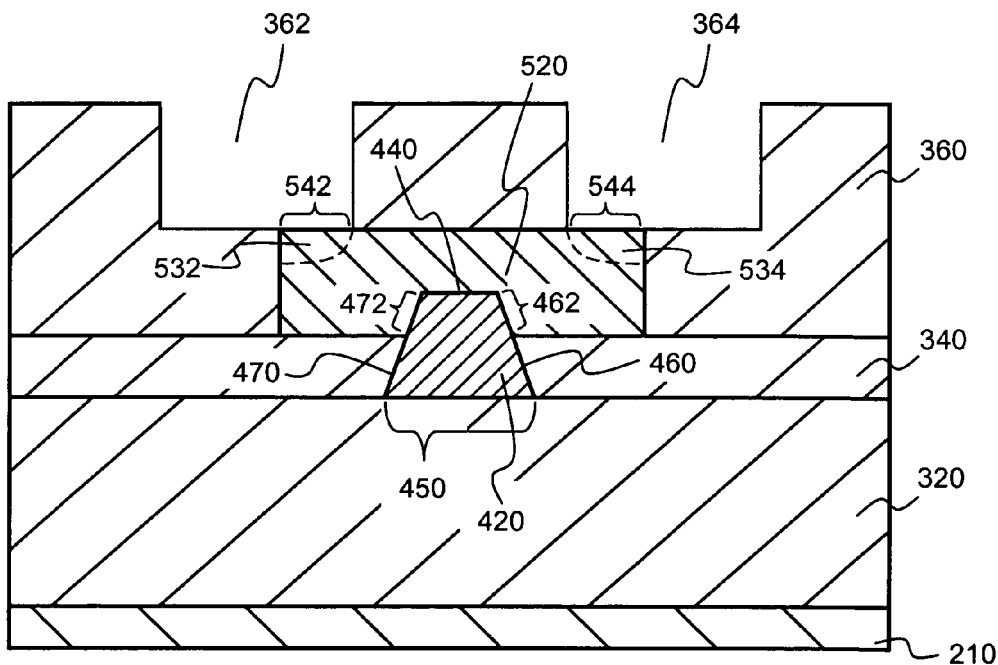
Figure 7I:
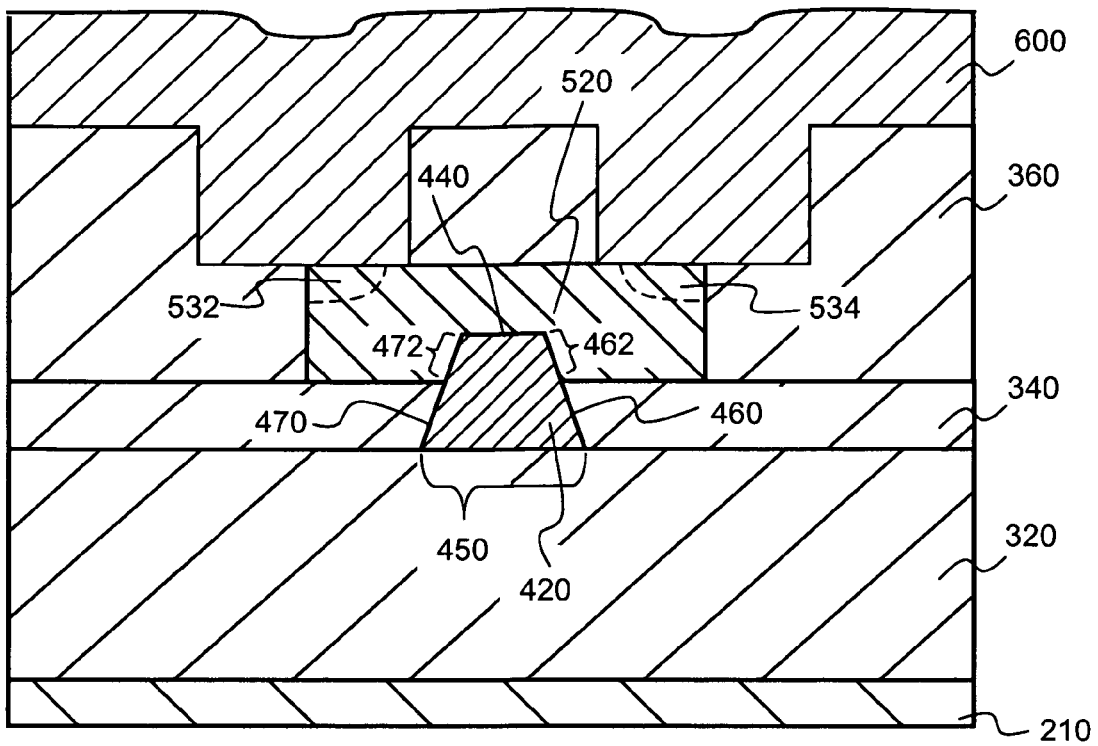

Continuing from FIG. 7G, metal contacts are then formed on the photodetector element 520. Methods for forming the metal contacts are similar to that as previously described in relation to FIGS. 6H-6J and are not discussed in detail here. In an embodiment of the present invention, the fabrication of the metal contacts begins by forming the third cladding layer 360 on the photodetector element 520 and second cladding layer 340 as shown in FIG. 7H, wherein the third cladding layer 360 includes openings 362, 364 formed therein. The third cladding layer 360 is made of the same type of materials as described in relation to FIG. 6H.

In one embodiment, the waveguide photodetector device can be formed as a p-i-n photodetector type by forming doped regions 532, 534 in the photodetector element 520 as shown in FIG. 7H. The method of forming doped regions 532, 534 in relation to FIG. 6H is applicable to FIG. 7H, and hence will not be discussed here.

Figure 7J:
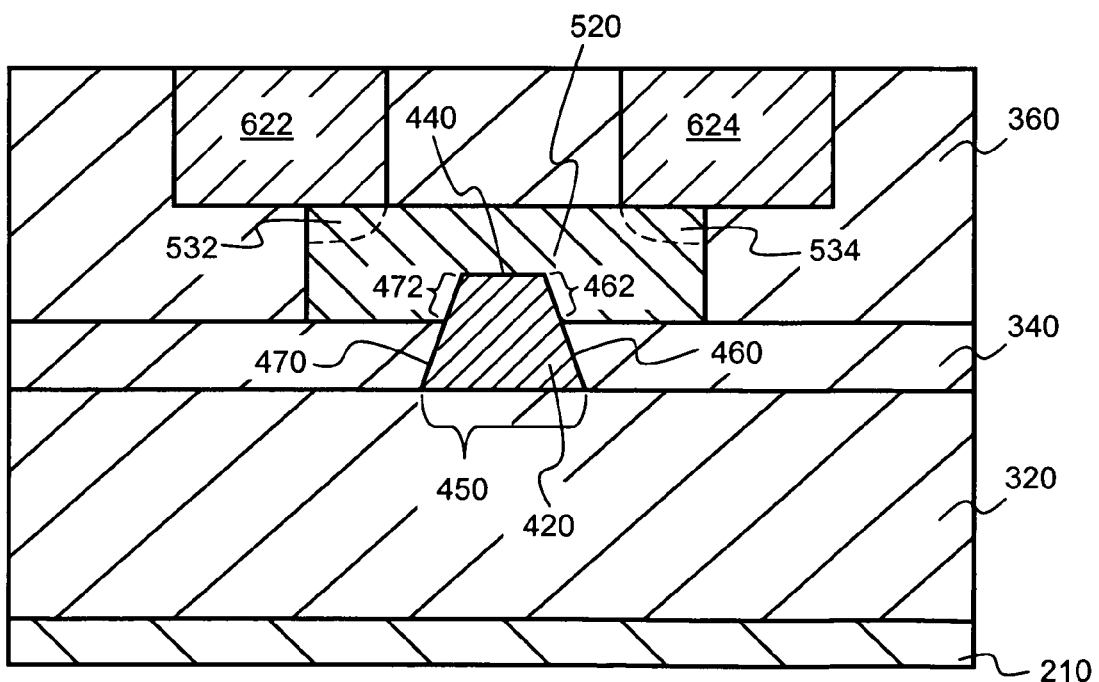

Next, metal contacts 622, 624 are formed in the openings 362, 364 of the third cladding layer 360 using the same processes as described in FIGS. 6I and 6J. In one embodiment, a metal layer 600 is blanket deposited on the third cladding layer 360 in FIG. 7I, and then planarized to form metal contacts 622, 624 in the third cladding layer 251 as shown in FIG. 7J. In another embodiment, the metal contacts 622, 624 are formed by selective deposition into the openings 362, 364 of the third cladding layer 360 in FIG. 7H.

In one embodiment, the waveguide photodetector device is a MSM photodetector type, wherein doped regions 532, 534 are not formed in the photodetector element 520. Instead, metal contacts 622, 624 are formed with materials having a work function in the range of 4.25 eV to 5.3 eV.

Figure 8:
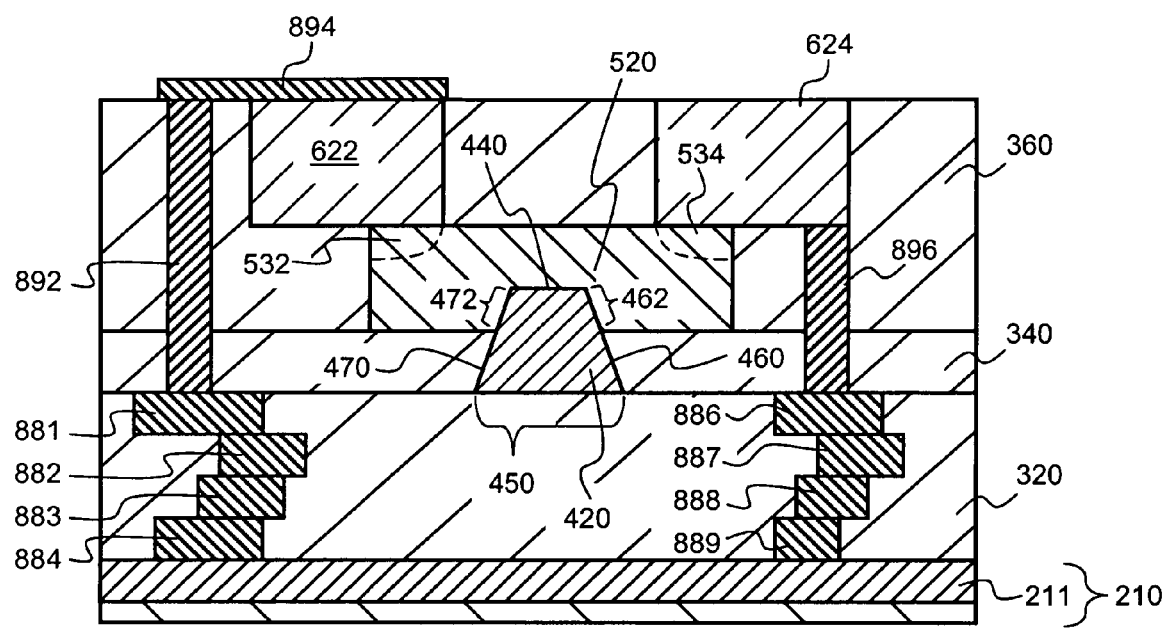
FIG. 8 is a cross-sectional view of a waveguide photodetector device in accordance with another embodiment of the present invention that can be fabricated using the method shown in FIGS. 7A-7J.

The method described in relation to FIGS. 7A-7J can also be used to fabricate a waveguide photodetector device integrated into an integrated circuit, as shown in FIG. 8. In this case, the first cladding layer 320 in FIGS. 7A-7J is a multilayer dielectric structure comprising the first stack of metal interconnects 881, 882, 883, 884, and the second stack of metal interconnects 886, 887, 888, 889 as discussed previously in FIG. 4. Base semiconductor layer 210 comprises a layer of active devices 211 that is coupled to the first stack of metal interconnects 881, 882, 883, 884, and second stack of metal interconnects 886, 887, 888, 889. In one embodiment, the layer of active devices 211 includes devices such as but not limited to transistors, rectifiers, isolation structures and capacitors that are formed as part of an integrated circuit.

A interconnect 896 can be formed in FIG. 7H, wherein a via or opening is formed in the second and third cladding layers 340, 360 before the depositing the interconnect 896 into the via. At FIG. 7J, the through-hole interconnect 892 can be formed by first creating a through-hole via extending through the second and third cladding layers 340, 360. Then the through-hole interconnect 892 is deposited into the through-hole via. Interconnect 894 is then formed on the third cladding layer 360 and couples the through-hole interconnect 892 to metal contact 622.

FIGS. 9A-9J illustrate a method of forming the waveguide photodetector device as shown in FIG. 5 according to one embodiment of the present invention. The fabrication of the waveguide photodetector device begins by forming a photodetector element on a substrate 202. In an embodiment of the present invention, the substrate 202 comprises a layer of photodetector material 500 formed onto a first cladding layer 320 that is disposed on a base semiconductor layer 210.

In one embodiment, the substrate 202 is formed by first depositing the first cladding layer 320 on the base semiconductor layer 210 using well known techniques such as but not limited to chemical vapor deposition (CVD), physical vapor deposition (PVD) and atomic layer deposition (ALD). Materials used for base semiconductor layer 210 and first cladding layer 320 are similar to that as discussed in relation to FIG. 6A and are applicable for FIG. 9A. The layer of photodetector material 500 is then blanket deposited on the top surface 322 of the first cladding layer 320 using well know deposition techniques such as but not limited to CVD, PVD and ALD. Materials used for the layer of photodetector material 500 are the same as previously discussed in FIG. 6F and are applicable in FIG. 9A.

In one embodiment, the substrate 202 is a silicon on insulator (SOI) substrate such that the layer of photodetector material 500 is the topmost silicon film of the SOI substrate. Furthermore, the first cladding layer 320 is the buried oxide layer of the SOI substrate, and base semiconductor layer 210 is the silicon substrate of the SOI substrate. The SOI substrate is formed by well known techniques such as but not limited to a separation by implantation of oxygen (SIMOX) process or wafer bonding process.

Figure 9A:
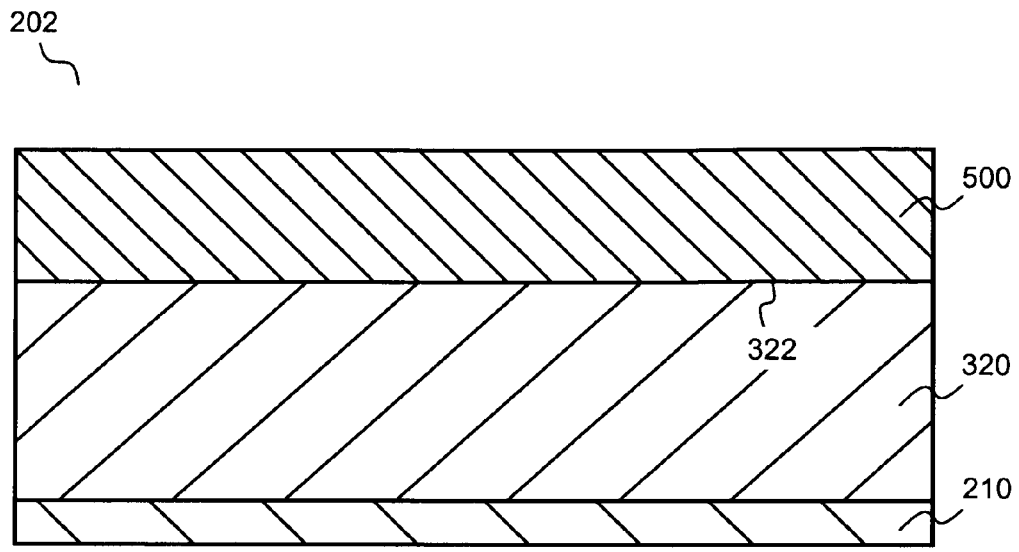
FIGS. 9A-9H illustrate a method of forming the waveguide photodetector device as shown in FIG. 5.
Figure 9B:
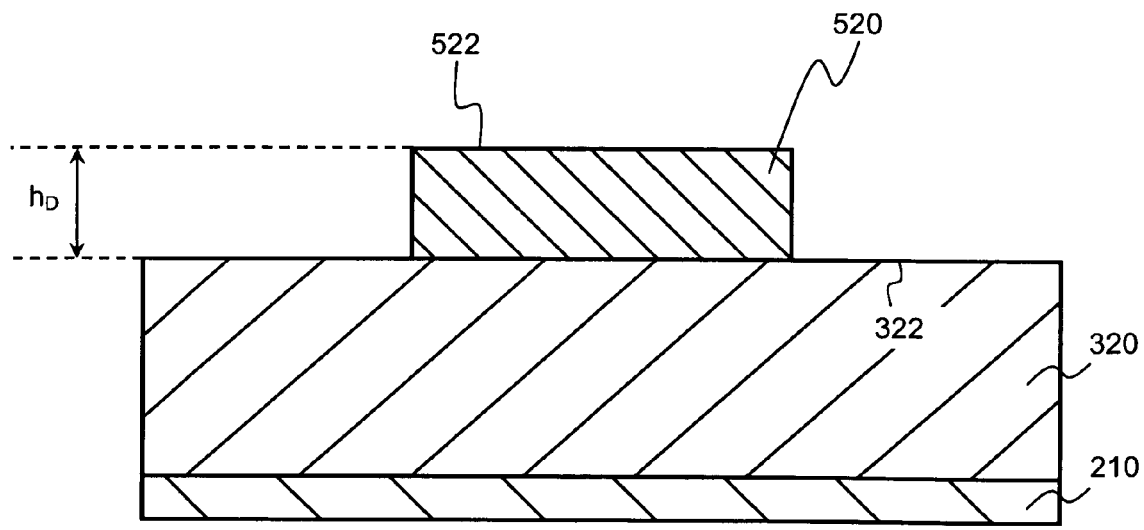

Next, the layer of photodetector material 500 is patterned to form a photodetector element with a trench thereon. In one embodiment, the layer of photodetector material 500 is patterned, using well-known photolithography and etching techniques, to form the photodetector element 520 with a desired thickness or height ($h_D$), as shown in FIG. 9B. In other words, the top surface 522 of photodetector element 520 is formed at a distance equivalent to $h_D$ above the top surface 322 of the first cladding layer 320. Etching techniques used to form photodetector element 520 include but are not limited to plasma etching, ion beam etching or reactive ion etching or using an etchant with a chemistry that etches the layer of photodetector material 500 but does not etch the first cladding layer 320.

Figure 9C:
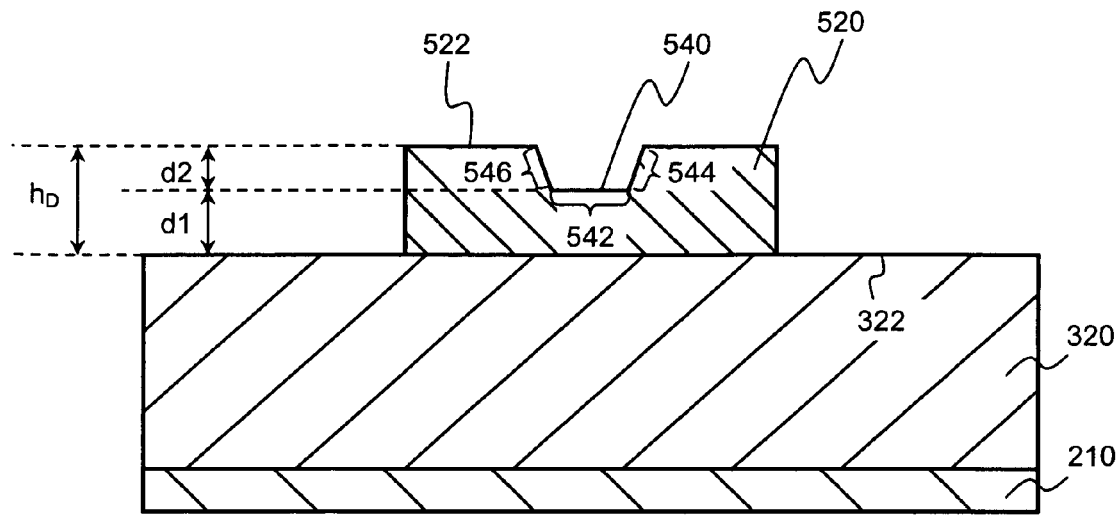
Figure 9D:
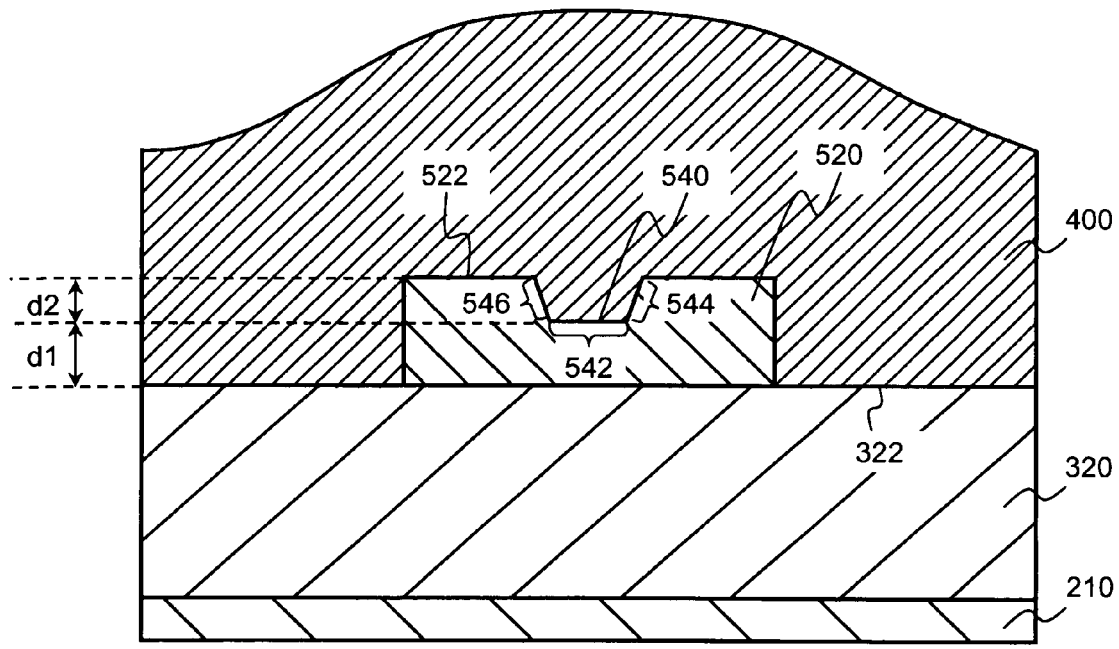

After forming the photodetector element 520, another photolithography and etching process is performed on photodetector element 520 to form a trench 540 thereon as shown in FIG. 9C. Trench 540 comprises a bottom surface 542 and sidewalls 544, 546, wherein the sidewalls 544, 546 extends from the bottom surface 542 of trench 540 to the top surface 522 of photodetector element 520. In particular, bottom surface 542 of trench 540 is formed at a distance d1 above the top surface 322 of the first cladding layer 320. Furthermore, bottom surface 542 of trench 540 is formed at a distance d2 below the top surface 522 of photodetector element 520.

Next, a waveguide element is formed on the trench 540 of photodetector element 520. The fabrication of the waveguide element begins, in FIG. 9D, by blanket depositing a layer of waveguide material 400 onto the first cladding layer 320 and onto the entire photodetector element 520 including the bottom surface 542 and sidewalls 544, 546 of trench 540. Layer of waveguide material 400 can be deposited using well know deposition techniques such as but not limited to CVD, PVD and ALD. Materials used for the layer of waveguide material 400 are the same as discussed in relation to FIG. 6A and are applicable in FIG. 9D.

Figure 9E:
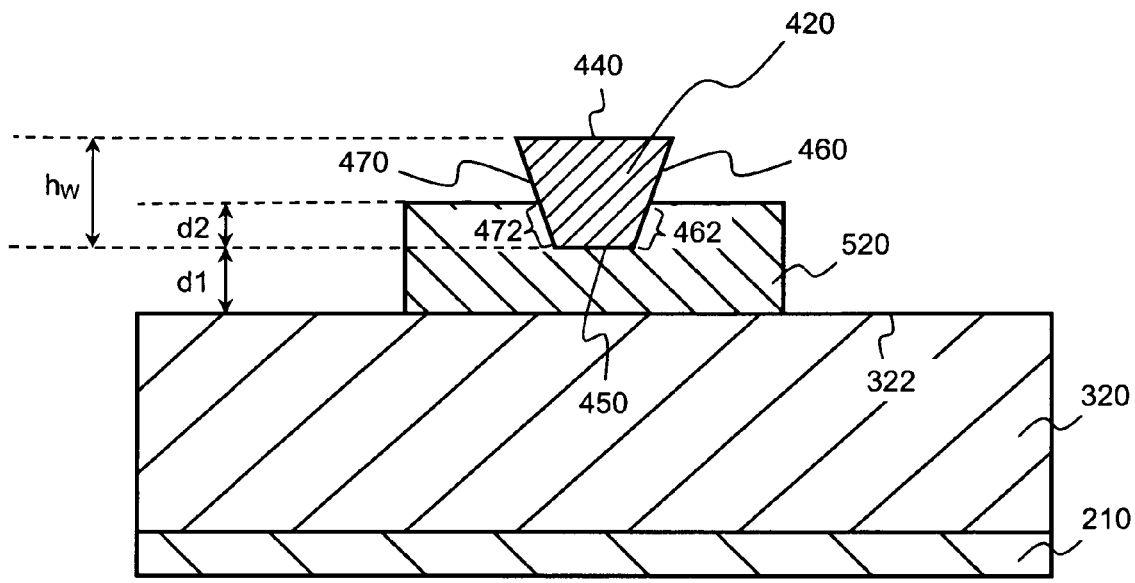

Next, the layer of waveguide material 400 is patterned using well-known photolithography and etching techniques to form a waveguide element 420 on the trench 540 of the photodetector element 520 as shown in FIG. 9E. Etching techniques include but are not limited to plasma etching, ion beam etching or reactive ion etching or using an etchant with a chemistry that etches the layer of waveguide material 400 but does not etch the photodetector element 520 and first cladding layer 320. Waveguide element 420 comprises a top surface 440, a bottom surface 450 and sidewalls 460, 470 extending from the top surface 440 to the bottom surface 450. Distance $h_W$ between the top surface 440 and bottom surface 450 refers to the thickness or height of the waveguide element 420. In one embodiment, the bottom surface 450, a portion 462 of sidewall 460 and a portion 472 of sidewall 470 is encapsulated by the trench 540 of photodetector element 520. By encapsulating the bottom surface 450 and at least a portion of each sidewalls 460, 470 of waveguide element 420 with the photodetector element 520, the coupling efficiency between the photodetector element 520 and waveguide element 420 is improved significantly. In one embodiment, each portion 462, 472 is at least one-third the length of each sidewall 460, 470.

In an embodiment of the present invention, the portion of waveguide element 420 that is desired to be encapsulated by the photodetector element 520 can be controlled by using the distance d1 and d2 as show in FIG. 9C. As discussed in FIG. 9C, a trench 540 is formed in the photodetector element 520 by photolithography and etching. Specifically, the bottom surface 542 of trench 540 is formed at distance d1 from the top surface 322 of first cladding layer 320, and also at distance d2 from the top surface 522 of the photodetector element 520. Both distance d1 and distance d2 are variable parameters that can be used to control the amount or portion of photodetector element 520 that encapsulates the waveguide element 420. By controlling the portion of photodetector element 520 encapsulating the waveguide element 420, the coupling between the waveguide element 420 and photodetector element 520 can be optimized to attain higher speed or responsivity for the waveguide photodetector device.

In one embodiment of the present invention, the bottom surface 450 and entire sidewalls 460, 470 of waveguide element 420 can be fully encapsulated by the photodetector element 520 by adjusting distance d2 to be equivalent to the height ($h_W$) of the waveguide element 420. In this case, the photodetector element 520 in FIG. 9B is formed with a thickness ($h_D$) equivalent to the total of distance d1 and height ($h_W$) of waveguide element 420. Then, in FIG. 9C, the bottom surface 542 of trench 540 is formed with distance d2 equivalent to height ($h_W$) of waveguide element. Subsequently, the waveguide element 420 is formed using similar process described in FIGS. 9C and 9D so that the bottom surface 450 and entire sidewalls 460, 470 of waveguide element 420 is encapsulated by the trench 540. Distance d1 may also be adjusted to control the amount of photodetector element 520 below the waveguide element 420.

In another embodiment, the distance d2 is reduced to almost zero so that the photodetector element 520 is formed on the bottom surface 450 of waveguide element 420. In this case, the waveguide element 420 is formed directly on the photodetector element 520 in FIG. 9B without forming the trench 540. Furthermore, distance d1 can be adjusted by controlling the etching process in FIG. 9B so as to ensure there is sufficient amount of photodetector element 520 for absorbing light from the bottom surface 450 of waveguide element 420.

Continuing from FIG. 9E, metal contacts are then formed on the photodetector element 520 using similar methods previously described in FIGS. 6H-6J. In an embodiment of the present invention, the fabrication of the metal contacts begins by forming a second cladding layer 340 on the photodetector element 520 and first cladding layer 320 as shown in FIG. 9F, wherein the second cladding layer 340 includes openings 362, 364 formed therein.

In one embodiment, the second cladding layer 340 with openings 362, 364 is formed by first blanketing depositing the second cladding layer 340 onto the waveguide element 420, photodetector element 520 and first cladding layer 320 using well known techniques such as but not limited to CVD, PVD and ALD. Then, second cladding layer 340 is planarized and etched to form the openings 362, 364, wherein the opening 362 exposes region 542 on the photodetector element 520, and opening 364 exposes region 544 on the photodetector element 520. The second cladding layer 340 is made of the same type of materials as described in relation to FIG. 3.

Figure 9F:
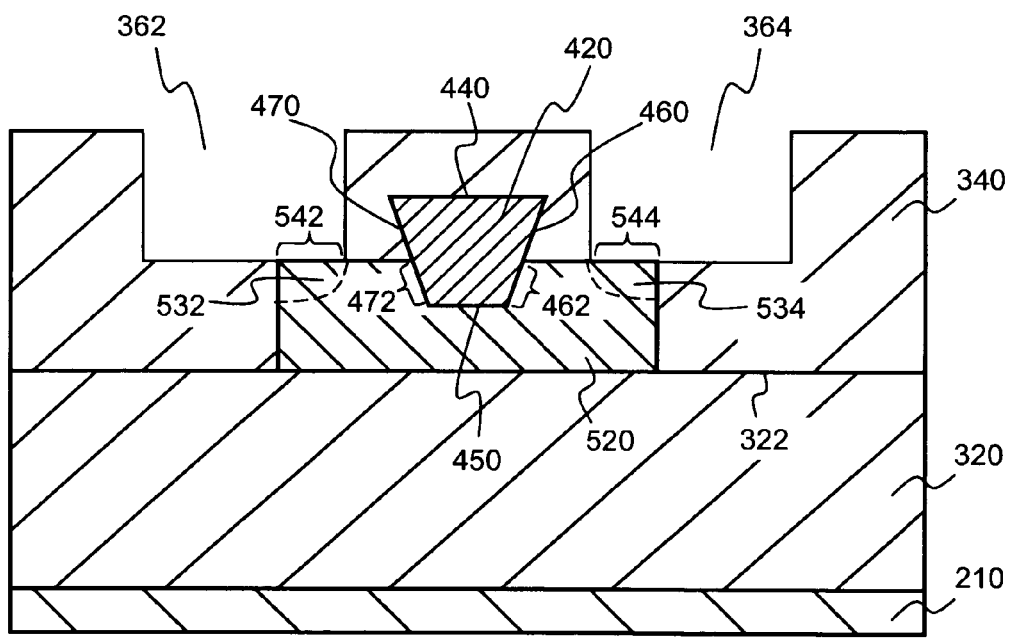

In one embodiment, the waveguide photodetector device can be formed as a p-i-n photodetector type by forming doped regions 532, 534 in the photodetector element 520 as shown in FIG. 9F. The method of forming doped regions 532, 534 is similar to FIG. 6H, and hence not discussed in detail here.

Figure 9G:
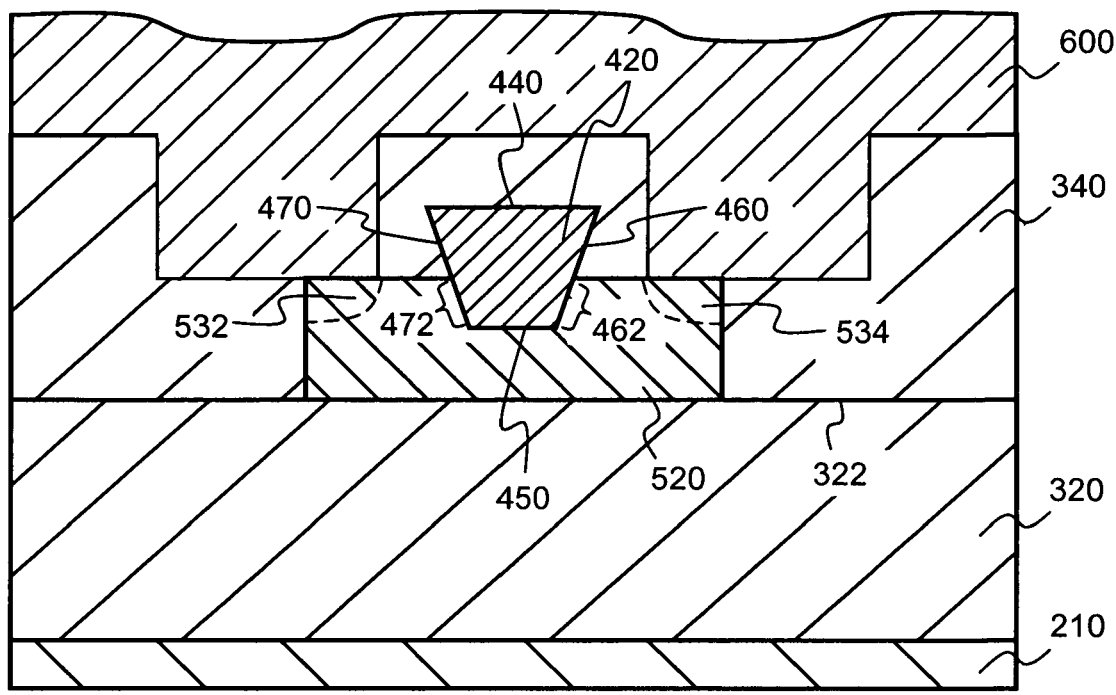
Figure 9H:
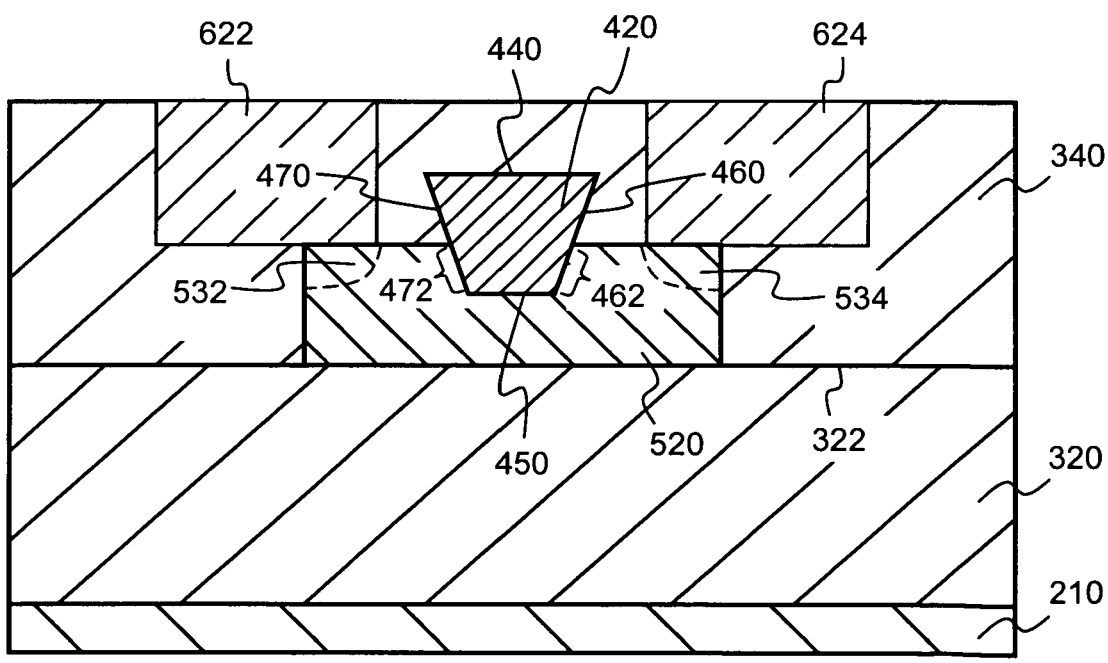

Next, metal contacts 622, 624 are formed in the openings 362, 364 of the second cladding layer 340 using the same processes as described in FIGS. 6I and 6J. In one embodiment, a metal layer 600 is blanket deposited on the second cladding layer 340, as shown in FIG. 9G, by well know methods such as but not limited to CVD, PVD or evaporation. The metal layer 600 is then planarized using well known techniques such as CMP or plasma etch back to form metal contacts 622, 624 in the second cladding layer 340 as shown in FIG. 9H. In another embodiment, the metal contacts 622, 624 are formed by selective deposition into the openings 362, 364 of the second cladding layer 340. Beginning from FIG. 9F, metal layers are selectively deposited, using well known methods such as electrolysis deposition, into openings 362, 364 to form the metal contacts 622, 624 as shown in FIG. 9H.

In one embodiment, the waveguide photodetector device is a MSM photodetector type, wherein doped regions 532, 534 are not formed in the photodetector element 520. Instead, metal contacts 622, 624 are formed with materials having a work function in the range of 4.25 eV to 5.3 eV.

Figure 10:
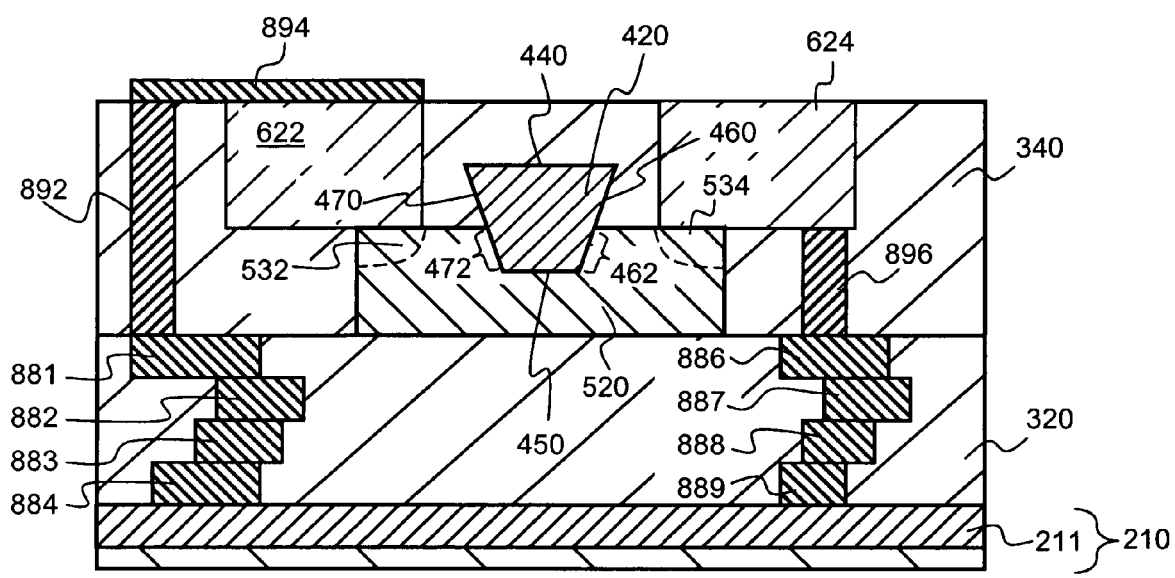
FIG. 10 is a cross-sectional view of a waveguide photodetector device in accordance with another embodiment of the present invention that can be fabricated using the method shown in FIGS. 9A-9H.

The method described in relation to FIGS. 9A-9H can also be used to fabricate a waveguide photodetector device integrated into an integrated circuit, as shown in FIG. 10. In this case, the first cladding layer 320 in FIGS. 9A-9H is a multi-layer dielectric structure comprising the first stack of metal interconnects 881, 882, 883, 884, and the second stack of metal interconnects 886, 887, 888, 889 as discussed previously in FIG. 4. An interconnect 896 can be fabricated at FIG. 9F, wherein a via or opening (not shown) is formed in the second cladding layer 340 before depositing the interconnect 896 into the via. Interconnect 892 can be formed at FIG. 9H by first creating a via (not shown) extending through the second cladding layer 340. Then the interconnect 892 is deposited into the via. Interconnect 894 is then formed on the third cladding layer 360 and couples the interconnect 892 to metal contact 622.

Several embodiments of the invention have thus been described. However, those ordinarily skilled in the art will recognize that the invention is not limited to the embodiments described, but can be practiced with modification and alteration within the spirit and scope of the appended claims that follow.

We claim:

1. A method of forming a semiconductor device comprising:
   providing a substrate;
   forming a waveguide element on the substrate, wherein the waveguide element comprises a top surface and sidewalls, wherein the sidewalls extend from the top surface to the substrate;
   forming a cladding layer onto the waveguide element and the substrate, wherein the cladding layer exposes the top surface of waveguide element and a portion of the sidewalls proximal to the top surface of waveguide element; and
   forming a photodetector element on the waveguide element, wherein the photodetector element abuts and encapsulates the top surface of waveguide element and the portion of the sidewalls exposed by the cladding layer proximal to the top surface of waveguide element, such that the photodetector element contacts the cladding along the waveguide element sidewall.

2. The method of claim 1, wherein forming the cladding layer onto the waveguide element and the substrate comprises:
   depositing a layer of cladding material onto the waveguide element and the substrate; and
   patterning the layer of cladding material to form the cladding layer.

3. The method of claim 2, wherein patterning the layer of cladding material to form the cladding layer comprises:
   planarizing the layer of cladding material to form the cladding layer; and
   selectively etching the cladding layer to form a trench thereon, wherein the trench exposes the top surface of waveguide element and the portion of the sidewalls proximal to the top surface of waveguide element.

4. The method of claim 3, wherein forming the photodetector element on the waveguide element comprises:
   depositing a layer of photodetector material onto the cladding layer and trench, wherein the layer of photodetector material encapsulates the top surface and the portion of sidewalls proximal to top surface of waveguide element; and
   planarizing the layer of photodetector material to form the photodetector element.

5. The method of claim 2, wherein patterning the layer of cladding material to form the cladding layer comprises selectively etching the layer of cladding material to form the cladding layer, wherein the cladding layer exposes the top surface of waveguide element and the portion of the sidewalls proximal to top surface of waveguide element.

6. The method of claim 5, wherein forming the photodetector element on the waveguide element comprises:
   depositing a layer of photodetector material onto the cladding layer and the top surface and the portion of sidewalls of waveguide element; and
   patterning the layer of photodetector material to form the photodetector element.

7. The method of claim 6, wherein patterning the layer of photodetector material to form the photodetector element comprises:
   planarizing the layer of photodetector material; and
   selectively etching the layer of photodetector material to form the photodetector element.

8. The method of claim 1, wherein forming the waveguide element on the substrate comprises:
   depositing a layer of waveguide material onto the substrate; and
   etching the layer of waveguide material to form the waveguide element.

9. The method of claim 1 further comprising:
   forming a n-type region and a p-type region in opposite sides of the photodetector element; and
   forming a metal contact on each n-type region and p-type region of the photodetector element.

10. The method of claim 9, wherein the n-type region and a p-type region in opposite sides of the photodetector element are formed by ion-implantation.

11. The method of claim 9, wherein forming the metal contact on each n-type region and p-type region of the photodetector element comprises:
    depositing a layer of dielectric material on the photodetector element and cladding layer;
    etching the layer of dielectric material to form openings therein, wherein the openings expose each of the n-type region and p-type region of the photodetector element;
    depositing a metal layer onto the layer of dielectric material and openings; and
    planarizing the metal layer to form the metal contact on each n-type region and p-type region of the photodetector element.

12. The method of claim 9, wherein the substrate comprises a layer of active devices coupled to the metal contact on each n-type region and p-type region of the photodetector element.

13. The method of claim 12, wherein the substrate further comprises a plurality of metal interconnects, and wherein the plurality of metal interconnects couple the layer of active devices to the metal contact on each n-type region and p-type region of the photodetector element.

14. The method of claim 1, wherein the cladding layer comprises silicon dioxide.

15. The method of claim 1, wherein the waveguide element comprises silicon or silicon nitride.

16. The method of claim 1, wherein the photodetector element comprises polycrystalline silicon or polycrystalline germanium.

17. A method of forming a semiconductor device comprising:
providing a substrate;
forming a photodetector element on the substrate, the photodetector element having a trench formed thereon; and
forming a waveguide element on the trench of photodetector element, wherein the waveguide element comprises a top surface, a bottom surface, and sidewalls extending from the top surface to the bottom surface, and wherein the trench of photodetector element encapsulates and abuts the bottom surface and a portion each sidewalls proximal to bottom surface of waveguide element;
depositing a layer of cladding material onto the waveguide element and the photodetector element, such that the cladding material layer contacts the photodetector element along the waveguide element sidewall.

18. The method of claim 17, wherein the forming the photodetector element on the substrate comprises:
depositing a layer of photodetector material onto the substrate; and
etching the layer of photodetector material to form the photodetector element and trench.

19. The method of claim 17, wherein forming the waveguide element on the trench of photodetector element comprises:
depositing a layer of waveguide material onto the photodetector element and trench; and
etching the layer of waveguide material to form the waveguide element.

20. The method of claim 17 further comprising:
forming a n-type region and a p-type region in opposite sides of the photodetector element; and
forming a metal contact on each n-type region and p-type region of the photodetector element.

21. The method of claim 20, wherein the n-type region and a p-type region in opposite sides of the photodetector element are formed by ion-implantation.

22. The method of claim 20, wherein forming the metal contact on each n-type region and p-type region of the photodetector element comprises:
etching the layer of cladding material to form openings therein, wherein the openings expose each of the n-type region and p-type region of the photodetector element;
depositing a metal layer onto the layer of cladding material and openings; and
planarizing the metal layer to form the metal contact on each n-type region and p-type region of the photodetector element.

23. The method of claim 20, wherein the substrate further comprises a layer of active devices, and wherein the layer of active devices is coupled to the metal contact on each n-type region and p-type region of the photodetector element.

24. The method of claim 23, wherein the substrate further comprises a plurality of metal interconnects, and wherein the plurality of metal interconnects couple the layer of active devices to the metal contact on each n-type region and p-type region of the photodetector element.

25. The method of claim 17, wherein the waveguide element comprises silicon nitride.

26. The method of claim 17, wherein the photodetector element comprises polycrystalline silicon or polycrystalline germanium.

* * * * *

UNITED STATES PATENT AND TRADEMARK OFFICE
CERTIFICATE OF CORRECTION

| | |
|---|---|
| PATENT NO. | : 8,290,325 B2 |
| APPLICATION NO. | : 12/217066 |
| DATED | : October 16, 2012 |
| INVENTOR(S) | : Miriam R. Reshotko et al. |

It is certified that error appears in the above-identified patent and that said Letters Patent is hereby corrected as shown below:

In column 19, line 14, in claim 17, after "portion" insert -- of --.

Signed and Sealed this
Fifteenth Day of January, 2013

David J. Kappos
*Director of the United States Patent and Trademark Office*